United States Patent
Amiri

(10) Patent No.: US 11,367,474 B2
(45) Date of Patent: Jun. 21, 2022

(54) ELECTRIC-FIELD-INDUCED SWITCHING OF ANTIFERROMAGNETIC MEMORY DEVICES

(71) Applicant: NORTHWESTERN UNIVERSITY, Evanston, IL (US)

(72) Inventor: Pedram Khalili Amiri, Chicago, IL (US)

(73) Assignee: NORTHWESTERN UNIVERSITY, Evanston, IL (US)

(*) Notice: Subject to any disclaimer, the term of this patent is extended or adjusted under 35 U.S.C. 154(b) by 0 days.

(21) Appl. No.: 17/260,113

(22) PCT Filed: Jul. 17, 2019

(86) PCT No.: PCT/US2019/042132
§ 371 (c)(1),
(2) Date: Jan. 13, 2021

(87) PCT Pub. No.: WO2020/018624
PCT Pub. Date: Jan. 23, 2020

(65) Prior Publication Data
US 2021/0383850 A1  Dec. 9, 2021

Related U.S. Application Data

(60) Provisional application No. 62/699,297, filed on Jul. 17, 2018.

(51) Int. Cl.
*G11C 11/16* (2006.01)

(52) U.S. Cl.
CPC ........ *G11C 11/161* (2013.01); *G11C 11/1673* (2013.01); *G11C 11/1675* (2013.01); *G11C 11/1697* (2013.01)

(58) Field of Classification Search
None
See application file for complete search history.

(56) References Cited

U.S. PATENT DOCUMENTS

| | | |
|---|---|---|
| 2012/0069648 A1 | 3/2012 | Kramer et al. |
| 2014/0071728 A1 | 3/2014 | Khalili Amiri et al. |

(Continued)

FOREIGN PATENT DOCUMENTS

| | | | | |
|---|---|---|---|---|
| EP | 3 185 245 A1 | 6/2017 | | |
| EP | 3185245 | * | 6/2017 | ........... H01L 43/065 |

OTHER PUBLICATIONS

International Search Report and Written Opinion in International Application No. PCT/US19/42132, dated Oct. 16, 2019 (5 pages).

*Primary Examiner* — James G Norman
(74) *Attorney, Agent, or Firm* — Benesch, Friedlander, Coplan & Aronoff LLP

(57) ABSTRACT

A new type of two-terminal magnetic memory device, referred to as antiferromagnetic voltage-controlled memory (AVM) device is disclosed. Antiferromagnetic (AFM) materials have zero magnetization, which makes it immune to external magnetic fields and opens to the possibility to implement high-density arrays without dipole coupling between adjacent devices. The AVM device combines a new state variable e.g., Néel vector l in a metallic (or non-metallic) AFM material with an electric-field-induced switching mechanism for writing of information. Utilizing electric fields E via an interfacial voltage-controlled magnetic anisotropy (VCMA) effect is a more efficient writing mechanism. The AVM device implements an antiferromagnetic tunnel junction (AFM-TJ) structure to exhibit high or low resistance states (HR, LR) corresponding to binary logic states of zero (0) or one (1). Both the AVM device structure and methods of writing a signal to the AVM device are disclosed.

20 Claims, 14 Drawing Sheets

(56) References Cited

U.S. PATENT DOCUMENTS

2014/0169084 A1 6/2014 Wunderlich et al.
2015/0123755 A1* 5/2015 Shibata .................... G11B 5/65
 335/296
2016/0099035 A1 4/2016 Khalili Amiri et al.

* cited by examiner

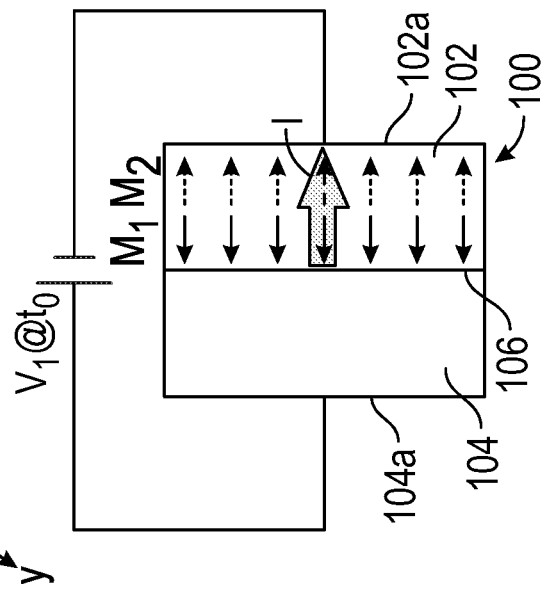
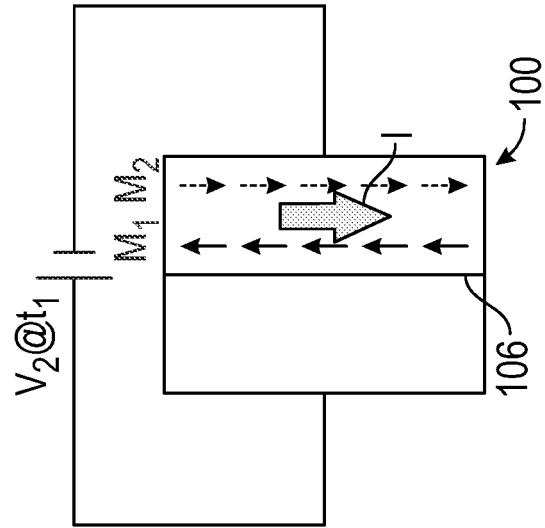
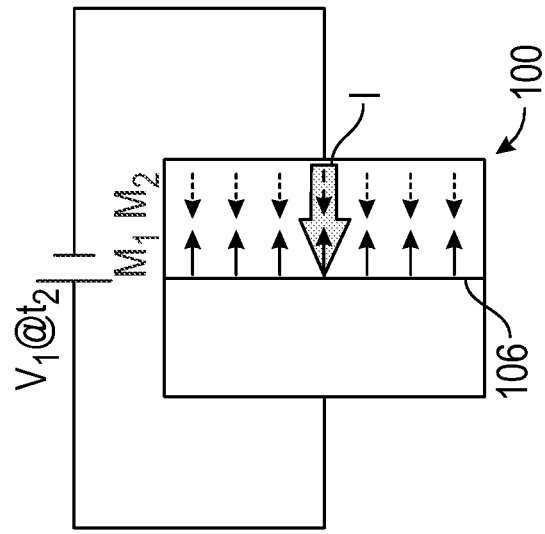
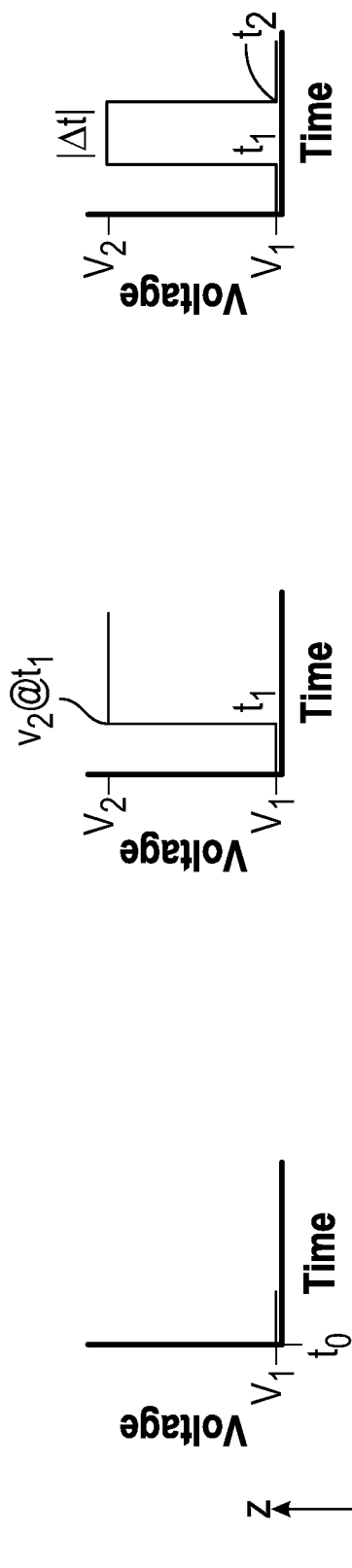
FIG. 1(A1)  FIG. 1(A2)  FIG. 1(A3)

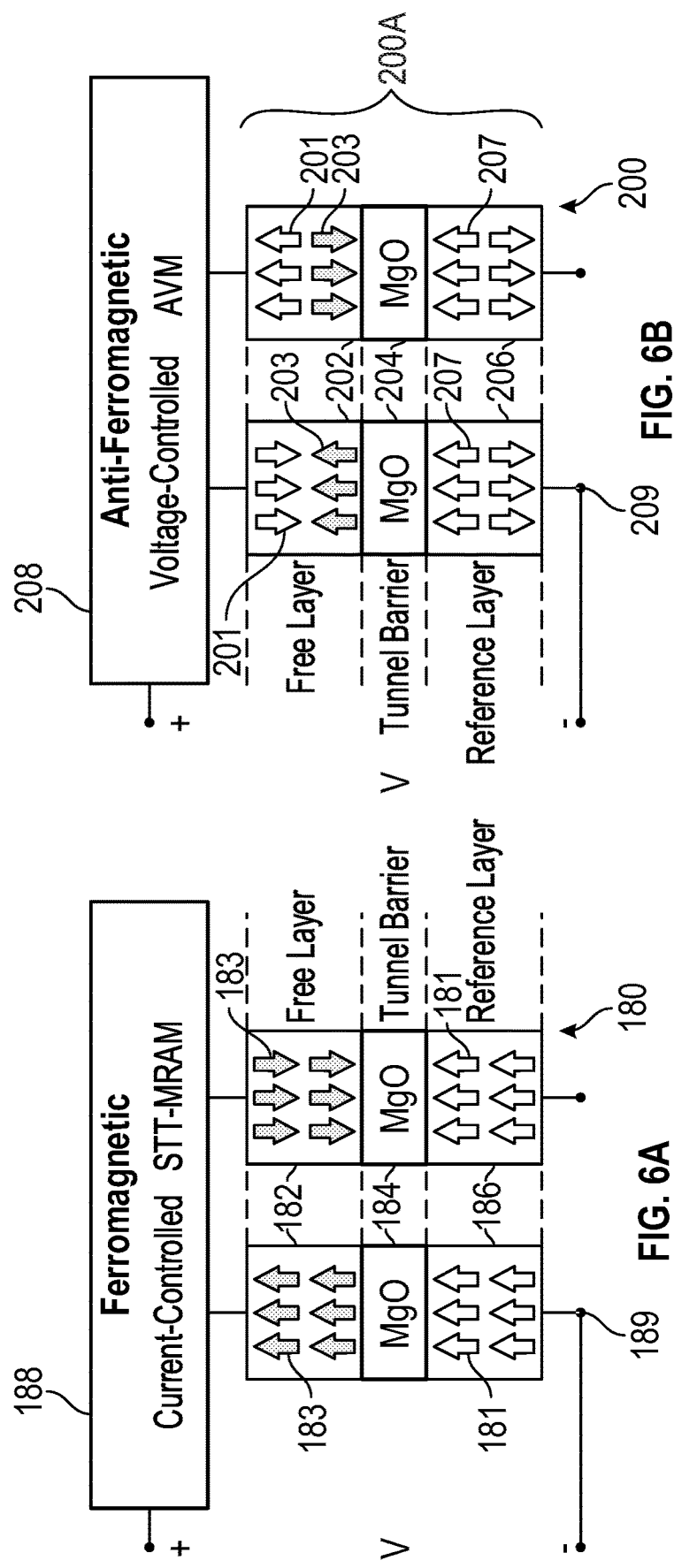

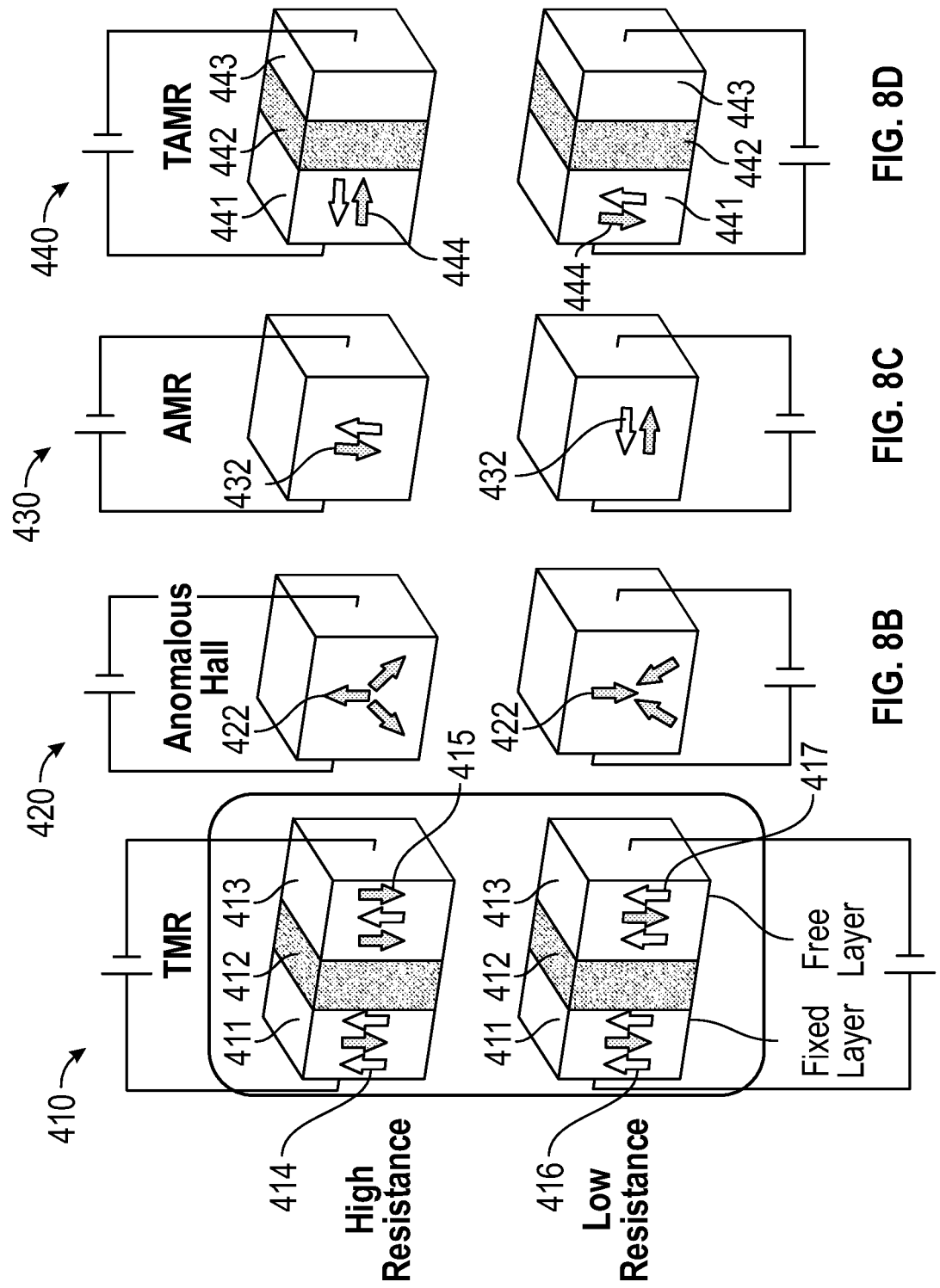

ELECTRIC-FIELD-INDUCED SWITCHING OF ANTIFERROMAGNETIC MEMORY DEVICES

CROSS-REFERENCE TO RELATED APPLICATIONS/INCORPORATION BY REFERENCE

The present application is a U.S. National Stage application under 35 U.S.C. § 371 of International Patent Application Serial No. PCT/US19/42132, filed on Jul. 17, 2019, which claims the benefit of priority under 35 U.S.C. § 119 from United States Provisional Patent Application Ser. No. 62/699,297 entitled "Picosecond Electric-Field-Induced Switching of Antiferromagnets," filed on Jul. 17, 2018, which is herein incorporated by reference in its entirety.

BACKGROUND

Computing systems may be undergoing a transformation from a logic-centric architecture towards a memory-centric architecture. In these architectures, the speed and energy efficiency of the systems are determined by the density, performance, and energy efficiency of their memory rather than their logic. Computational paradigms have emerged that are not based on traditional Turing and von Neumann principles. These paradigms solve some of the time and energy limitations faced by computers. Many memory technologies are too slow, too expensive, or too complex, including existing ferromagnetic memory devices which uses current-controlled methods to change magnetization vector in ferromagnet material, to be used in this paradigm.

BRIEF DESCRIPTION OF DRAWINGS

FIG. 1(A1) depicts an initial orientation (Out-Of-Plane or OOP) of two magnetization sub-lattices, M1, M2 and a Néel vector l of an antiferromagnetic (AFM) layer of an exemplary AVM device, when no electric field is applied.

FIG. 1(A2) is a rotated orientation (90 degree to In-Plane or IP) of the two magnetization sub-lattices, M1, M2 and a rotated Néel vector l of the antiferromagnetic (AFM) layer of the exemplary AVM device, when an electric field is applied.

FIG. 1(A3) is a resonant switching of the orientation (e.g. another rotation to an opposite Out-Of-Plane or OOP) of the two magnetization sub-lattices, M1, M2 and the Néel vector l of the antiferromagnetic (AFM) layer of the exemplary AVM device, after a duration of time that an electric field in FIG. 1(A2) is applied, to form a short pulse.

FIG. 6A is a ferromagnetic current-controlled spin transfer torque (STT) device having a magnetic tunnel junction (MTJ), information is written by switching an electric current.

FIG. 6B is an AVM device having a magnetic tunnel junction (MTJ) 200A through which information is written by switching an electric field (instead of current).

FIGS. 8A-8D are different mechanisms of magneto-resistance exhibited by different configurations of antiferromagnetic materials.

DETAILED DESCRIPTION

Figure 1B:
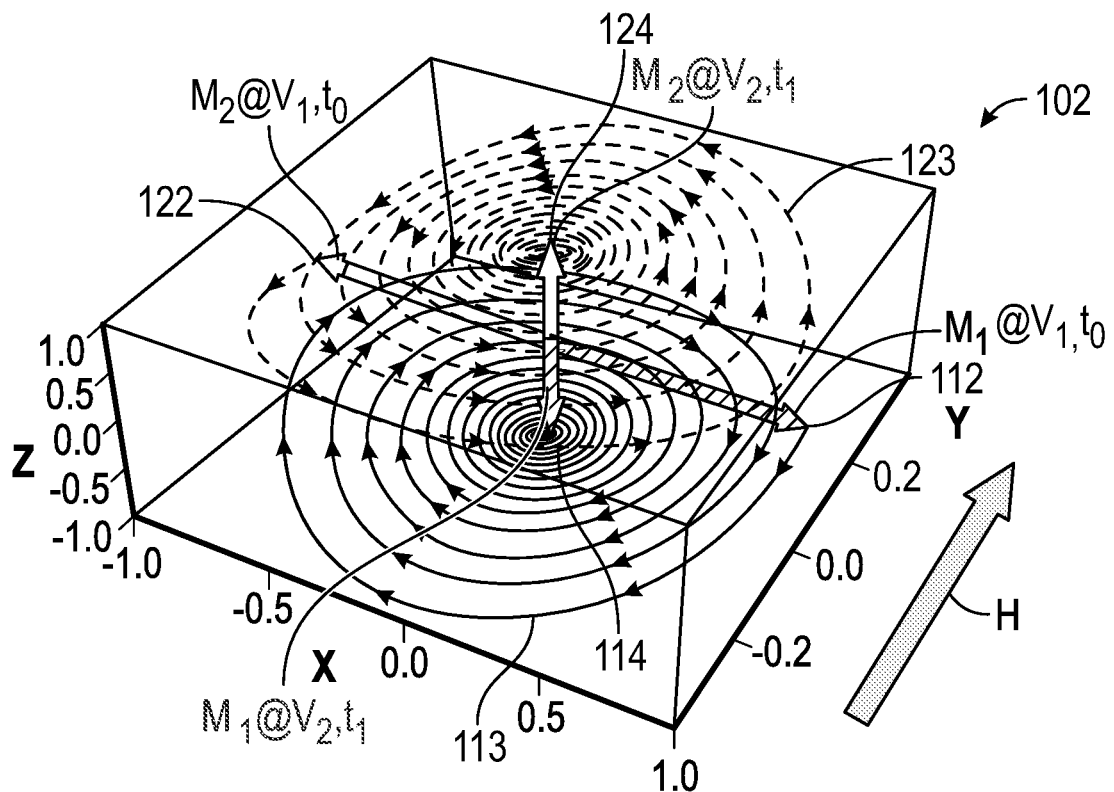
FIG. 1B is a time simulated trajectories of the two magnetization sub-lattices, M1, M2 of the antiferromagnetic (AFM) layer of the exemplary AVM device, where a continuous electric field is applied as shown in FIG. 1(A2).

This disclosure relates to the field of magnetic memory devices. More specifically, a new type of two-terminal magnetic memory device, referred to as antiferromagnetic voltage-controlled memory (AVM) device is disclosed. Antiferromagnetic (AFM) materials have zero magnetization, which makes it immune to external magnetic fields and opens to the possibility to implement high-density arrays without dipole coupling between adjacent devices.

An AVM device combines a new state variable e.g., Néel vector l (Néel vector "l" is written as a lower case alphabet "L" throughout description) in a metallic (or non-metallic) antiferromagnet (AFM) material with an electric-field-induced switching mechanism for writing of information. Utilizing electric fields "E" via an interfacial voltage-controlled magnetic anisotropy (VCMA) effect is a more efficient writing mechanism compared to a writing mechanism which requires a high current density. An AVM device may exhibit a switching speed many orders of magnitude faster (<0.1 ns) (nanosecond) and substantially more energy-efficient (<0.1 fJ/bit) (femtoJoule) than existing ferromagnetic memory devices. Another advantage of this technology is that the AVM device may be manufactured from materials used in the magnetic memory industry using silicon semiconductor processing techniques.

FIG. 1(A1) depicts an initial orientation (Out-Of-Plane or OOP) of two magnetization sub-lattices, M1, M2 and a Néel vector l (Néel vector "l" is written as a lower case alphabet "L" throughout description) of an antiferromagnetic (AFM) layer 102 of an exemplary antiferromagnetic voltage-controlled memory (AVM) device 100, when no electric field is applied. As shown, the AVM device 100 may include a layer 102 of AFM material in close proximity to a layer 104 of dielectric (DE) material. In an embodiment, the layer 102 of AFM material is in direct contact with the layer 104 of DE material at an interface 106.

The layer 102 of AFM material may include at least two sublattices of respective magnetizations M1 and M2, where a vector sum M=M1+M2 in the layer 102 of AFM material may be zero or close to zero in an absence of an external stimuli (such as an electric field E or magnetic field. A vector difference also known as Néel vector (shown as a shaded arrow in FIGS. 1(A1) to 1(A3)), l=M1−M2 may be defined in the layer 102 of AFM material which l (e.g., Néel vector) may form an Θ (reference to z axis) with respect to the interface 106 between the layer of DE 104 and the layer 102 of AFM material. The opposite surfaces of the layer of DE 104 and the layer 102 of AFM material may be partly or fully deposited with respective metallic electrodes 102a, 104a sandwiching the layer 102 of AFM and the layer of DE materials 104a, which the two metallic electrodes 102a, 104a may be configured to connect to a voltage supply V.

An anisotropy of the layer 102 of AFM material may be represented by the angle formed with respect to the interface 106 between the layer 104 of DE and the layer 102 of AFM material, that is the angle Θ may be modified by an applied electric field E (through an applied voltage V1 to V2 held constant starting at t1, see FIG. 1(A2)) across the layer 104 of DE material, or through a pulsed electric field (V2 is held over a duration Δt as shown in FIG. 1(A3)).

FIG. 1(a2) depicts a rotated orientation (90 degree to In-Plane or IP) of the two magnetization sub-lattices, M1, M2 and a rotated Néel vector l of the layer 102 of AFM material in an exemplary AVM device 100. Thus, when the electric field E is applied across the layer 104 of DE material, depending on whether the electric field is a continuous or pulsed, the angle Θ may have a value of about 0 degree (with a range of +/−5 degrees) or about 90 degrees (with a range of +/−5 degrees), the angle Θ is formed with respect to the interface 106 between the layer 104 of DE and the layer 102 of AFM material. When the angle Θ is at about 0 degree, it corresponds to the Néel vector l being in-plane (IP) with respect to the AFM/DE interface 106, and the angle Θ at about 90 degrees corresponds to the Néel vector l being out-of-plane (OOP) with respect to the interface 106 between the layer 104 of DE and the layer of AFM material.

The applied electric field E across the layer 104 of DE material is formed by applying a pulsed voltage across the two metallic electrodes 102a, 104a through connecting to the voltage supply "V". In an embodiment, the layer of AFM material may be a portion of one of the two metallic electrodes 102a, 104a. In other words, a surface of the layer 102 of AFM and a surface of the layer 104 of DE material may be entirely metallized or partially metallized through a process such as sputtering.

In some devices, the layer 104 of DE material may be comprised of Magnesium oxide (MgO) or Nickel oxide (NiO), and the layer 102 AFM may be composed of one of: alloy of iron and Manganese (FeMn), alloy of Platinum and Manganese (PtMn), alloy of Iridium and Manganease (IrMn), alloy of Iron and Rhodium (FeRh), alloy of Cobalt and Terbium (CoTb), alloy of Gadolinium and Iron (GdFe), or Nickel oxide (NiO). The two metallic electrodes 102a, 104a may be composed of one of elements: Tantalum (Ta), Iridium (Ir), Molybdenum (Mo), Platinum (Pt), Tungsten (W), Ruthenium (Ru), Copper (Cu), Hafnium (Hf), Bismuth (Bi), or any combinations thereof.

Hybridization of orbitals at the AFM/dielectric interface 106 may generate an interfacial perpendicular anisotropy in the AFM layer 102. Therefore, an application of a voltage V across the metallic electrodes 102a, 104a may create an electric field as low as 100 mV/nm could induce a reversal of Néel vector l (shown as a large shaded arrow in FIGS. 1(A1)-1(A3)) in the layer 102 of AFM material, resulting in a change of an easy axis (spin axis) of the AFM material, and rotating the Néel vector l from a perpendicular (reference to z axis) direction to an in-plane (IP) (parallel to z axis) direction. If the applied voltage is a pulsed, stimulus 107 (a short pulse width Δt as shown in FIG. 1(A3)), a resonant switching (e.g., flipping at about 180 degrees) frequency of the Néel vector l of the layer 102 of AFM material in the TeraHertz (THz) range may take place. More specifically, after a pulsed electric field is applied, a resonant switching of the orientation (e.g., flipped 180 degrees) to an opposite Out-Of-Plane (OOP) orientation of the two magnetization sub-lattices M1, M2. Accordingly, the Néel vector l (l=M1−M2) also flips to an opposite direction in the antiferromagnetic (AFM) layer of the exemplary AVM device as shown in FIG. 1(A3).

FIG. 1B depicts time simulated trajectories 113, 123 of the two magnetization sub-lattices, M1, M2 of the antiferromagnetic (AFM) layer 102, where a continuous electric field E is applied through holding the voltage at V2 after time t2, as shown in FIG. 1(A2). FIG. 1b shows that at time t0 (initial condition), the anisotropy easy axis and the two magnetization sublattices M1, M2 having opposite initial orientations (in positive x and negative x directions which are out-of-plane) at start locations 112, 122, respectively.

At time t1, a step voltage from V1 to V2 may be applied and held continuously at voltage level V2 to generate an electric field (not shown) and an associated small magnetic field H (shown in a positive y direction). A dynamic simulation of a movement over time of the anisotropy easy axis of magnetization sublattice M1 pointing in a positive x direction at the start location 112, may follow a trajectory 113 to settle at a final location 114 (in ps time), to a 90 degrees rotated orientation pointing in negative z direction. Likewise, the anisotropy easy axis of sublattice M2 pointing in a negative x direction at the start location 122, may follow a trajectory 123 to settle at a final location 124 (in picosecond (ps) time), to about a 90 degree rotated orientation pointing in a positive z direction.

Figure 1C:
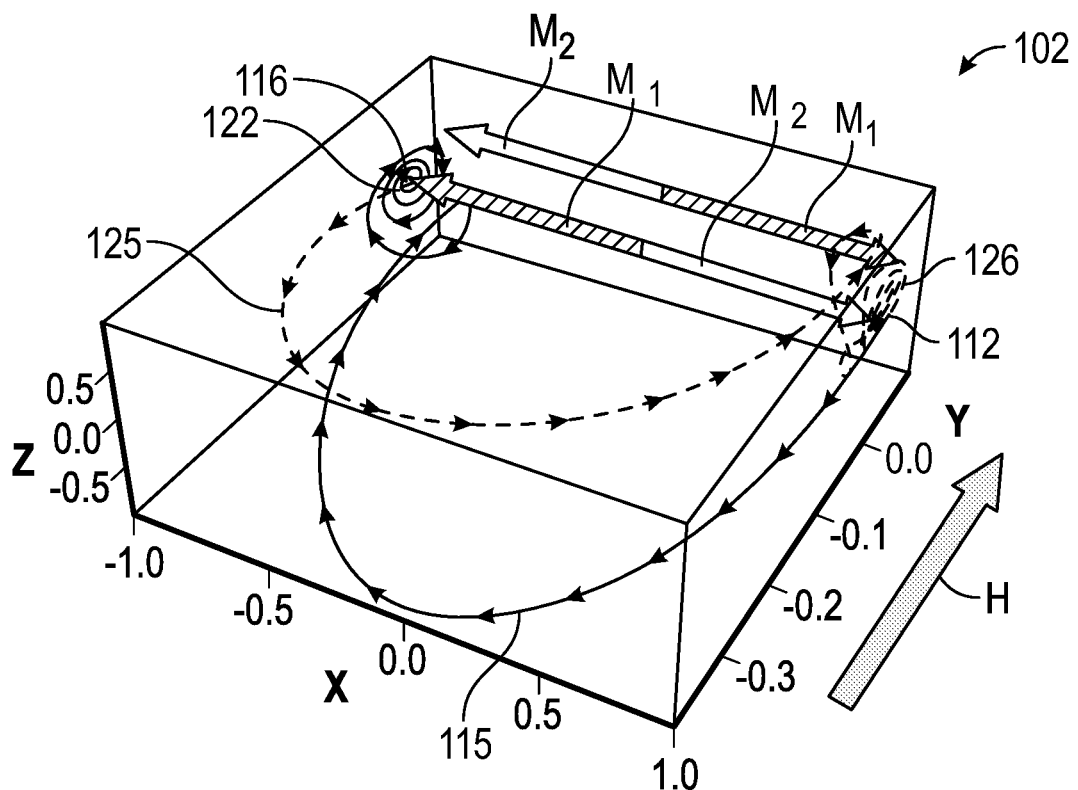
FIG. 1C is a time simulated trajectories of the two magnetization sub-lattices, M1, M2 of the antiferromagnetic (AFM) layer of the exemplary AVM device, after an electric field is pulsed as shown in FIG. 1(A3).

FIG. 1C depicts time simulated trajectories of the two magnetization sub-lattices, M1, M2 of the antiferromagnetic (AFM) layer of the exemplary AVM device, after an electric field is pulsed as shown in FIG. 1(A3). FIG. 1c shows at time t0 (an initial condition), the anisotropy easy axis and the two magnetization sublattices M1, M2 having opposite initial orientations (in positive x and negative x directions which are out-of-plane) at start locations 112, 122, respectively.

At time t1, a pulsed voltage (such as pulse width Δt=about 20 ps, from V1 to V2 at t1 and return to V1 at t2) may be applied to generate an electric field (not shown) and an associated small magnetic field H (shown in positive y direction). A dynamic simulation of a movement over time of the anisotropy easy axis of magnetization sublattice M1 pointing in a positive x direction at the start location 112, may follow a trajectory 115 to settle at a final location 116 (in ps time), to a 180 degrees rotated orientation pointing in negative x direction. Likewise, the anisotropy easy axis of sublattice M2 pointing in a negative x direction at the start location 122, may follow a trajectory 125 to settle at a final location 126 (in ps time), to a 180 degrees rotated orientation pointing in positive x direction.

Figure 2A:
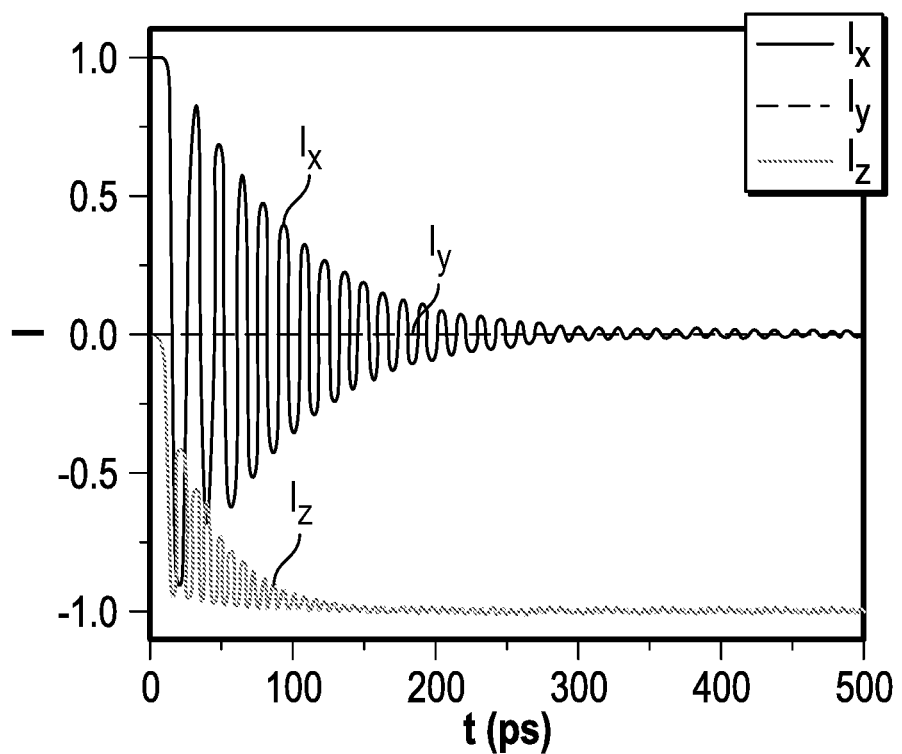
FIG. 2A is a time response of three components (lx, ly, lz) of a Néel vector l in the antiferromagnetic (AFM) layer of the exemplary AVM device, when a continuous electric field as shown in FIG. 1(A2), is applied.
Figure 2B:
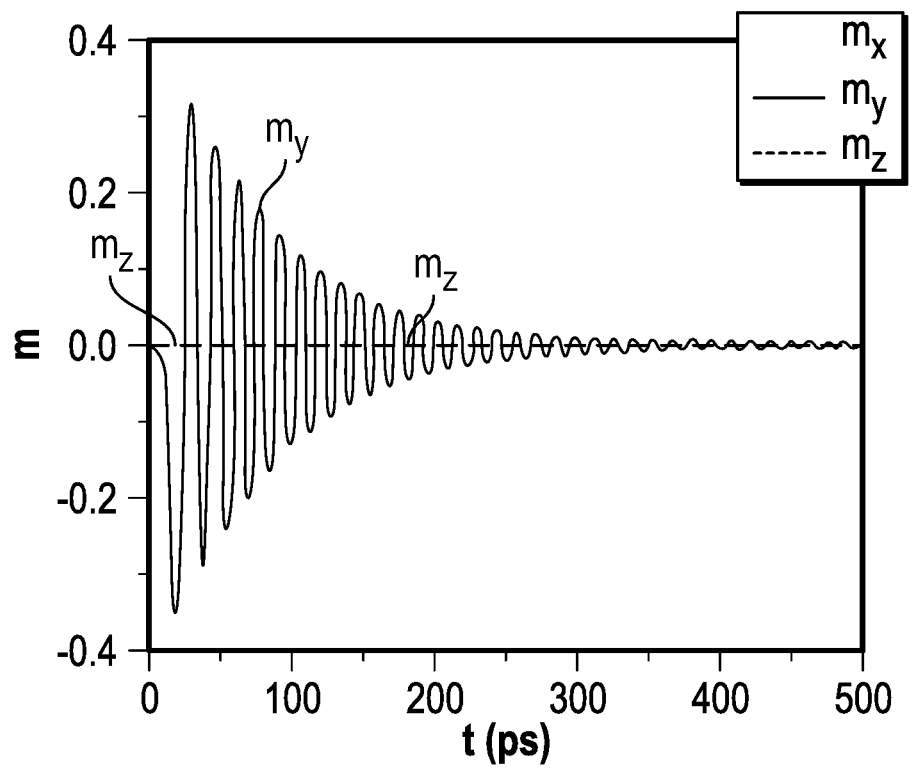
FIG. 2B is a time response of three components (mx, my, mz) of a ferromagnetic (FM) vector in the antiferromagnetic (AFM) layer of the exemplary AVM device, when a continuous electric field as shown in FIG. 1(A2), is applied.

FIG. 2A depicts a time response of three components (lx, ly, lz) of a Néel vector l in the antiferromagnetic (AFM) layer 102 of the exemplary AVM device 100, when a continuous electric field E is applied as shown in FIG. 1(A2). FIG. 2B depicts a time response of three components (mx, my, mz) of a ferromagnetic (FM) vector in the antiferromagnetic (AFM) layer of the exemplary AVM device, when a continuous electric field, is applied as shown in FIG. 1(A2).

More specifically, a time evolution of the three components (lx, ly, lz) of the Néel vector l, and the three components (mx, my, mz) of the ferromagnetic vector m for a continuous (e.g. step) electric field E of such as 1 V/nm and an applied bias magnetic field H of 100 Oe. An initial easy axis Néel vector l may be along the positive x axis (or negative x axis). After applying the electric field E, the Néel vector l may rotate to the positive z axis (on the new easy anisotropy plane). A small component of the ferromagnetic vector is present during the rotation of the Néel vector l, induced by the application of the magnetic field H in the positive y direction and the oscillations of the two magnetization sublattices M1, M2. When the Néel vector l is fully switched from the x axis to the z axis, the ferromagnetic vector value may be restored to zero.

Figure 3:
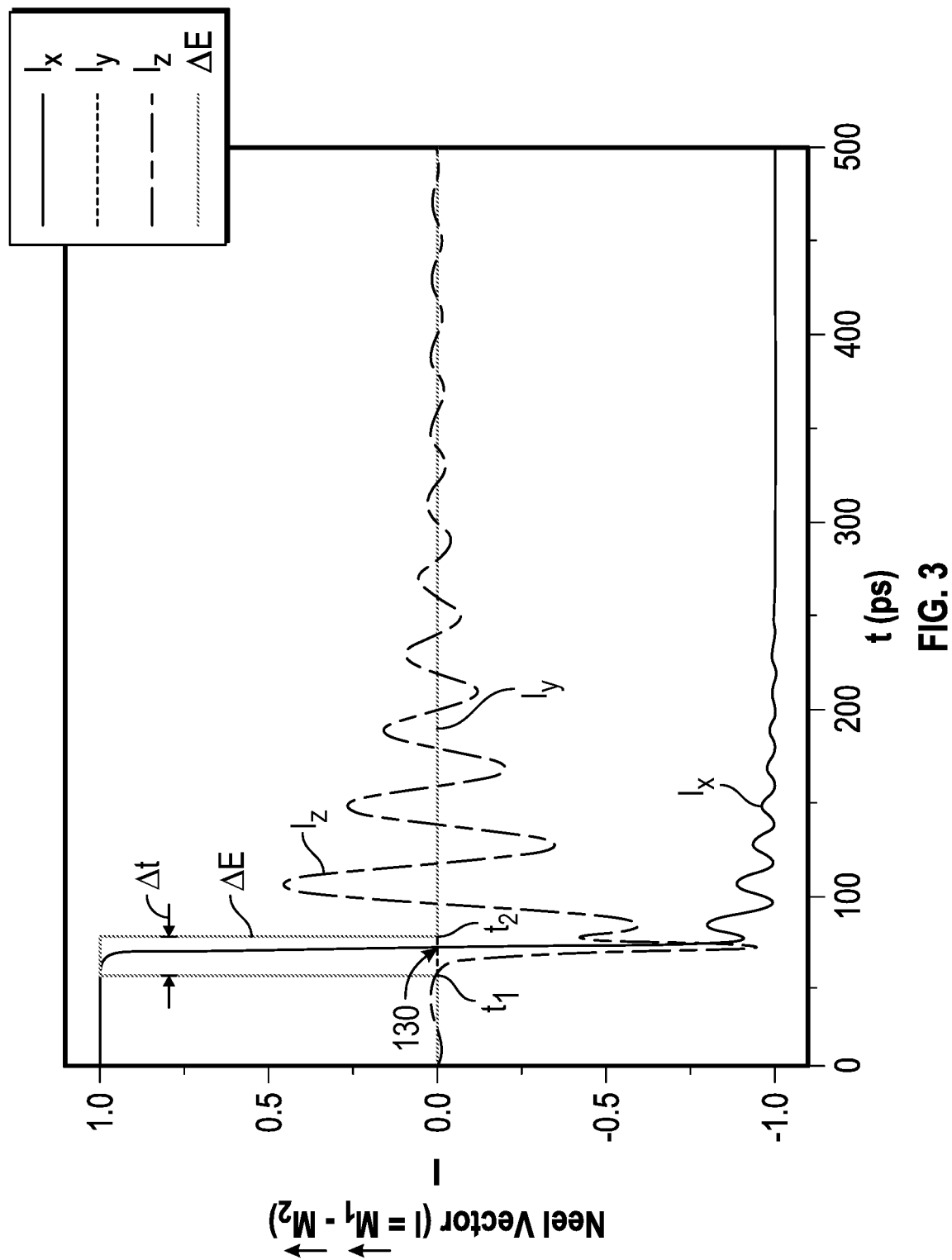
FIG. 3 is a time response of switching of the three components (lx, ly, lz) of the Néel vector l when an electric field pulse $\Delta E$ of 1V/nm is applied, in the antiferromagnetic (AFM) layer of the exemplary AVM device, as shown in FIG. 1(A3).

FIG. 3 depicts a time response of switching of the three components (lx, ly, lz) of the Néel vector l, in response to an electric field 1V/nm (volt/nanometer) as a pulse of 21 ps is applied at constant bias magnetic field H of 100 Oe, as shown in FIG. 1(a3). The Néel vector l makes a half oscillation 130 during the application of the electric field pulse ΔE. There is an incubation time (to be described) from the application of the electric field pulse to the initial rotation of the Néel vector l.

Figure 4A:
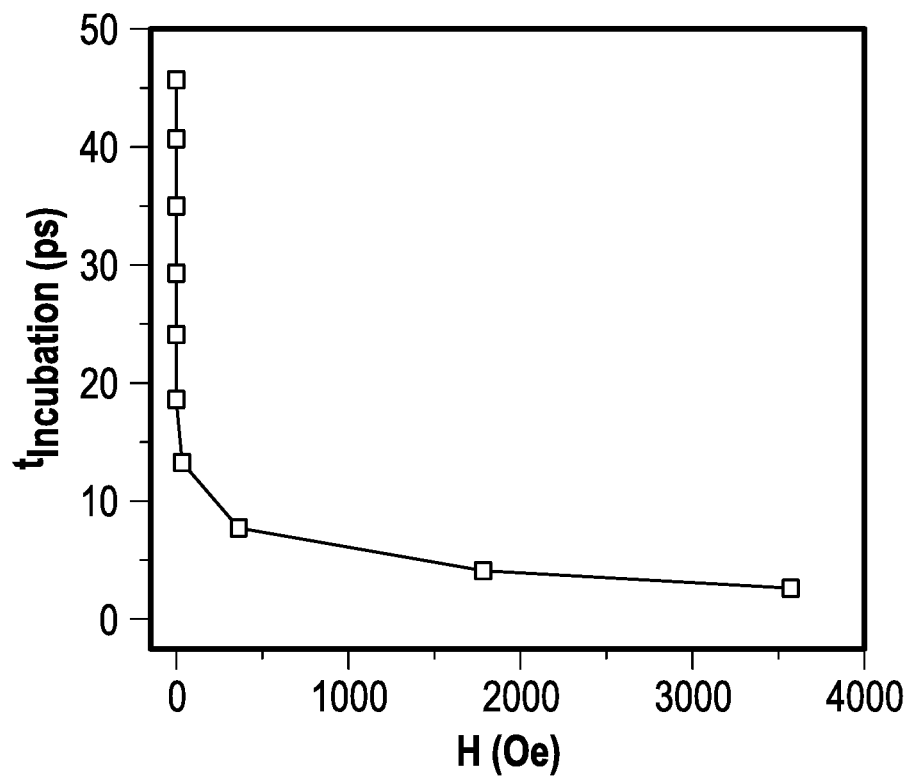
FIG. 4A is an incubation time as a function of an applied magnetic field at a constant electric field of 1V/nm to the antiferromagnetic (AFM) layer of the exemplary AVM device.

FIG. 4A depicts an incubation time as a function of an applied magnetic field at a constant electric field of 1V/nm to the antiferromagnetic (AFM) layer of the exemplary AVM device. As seen, a small magnetic field of 100 Oe (Oersted) is sufficient to reduce the incubation substantially, making the AVM devices ideal for high integration memory density with fast switching speed and highly energy efficient.

Figure 4B:
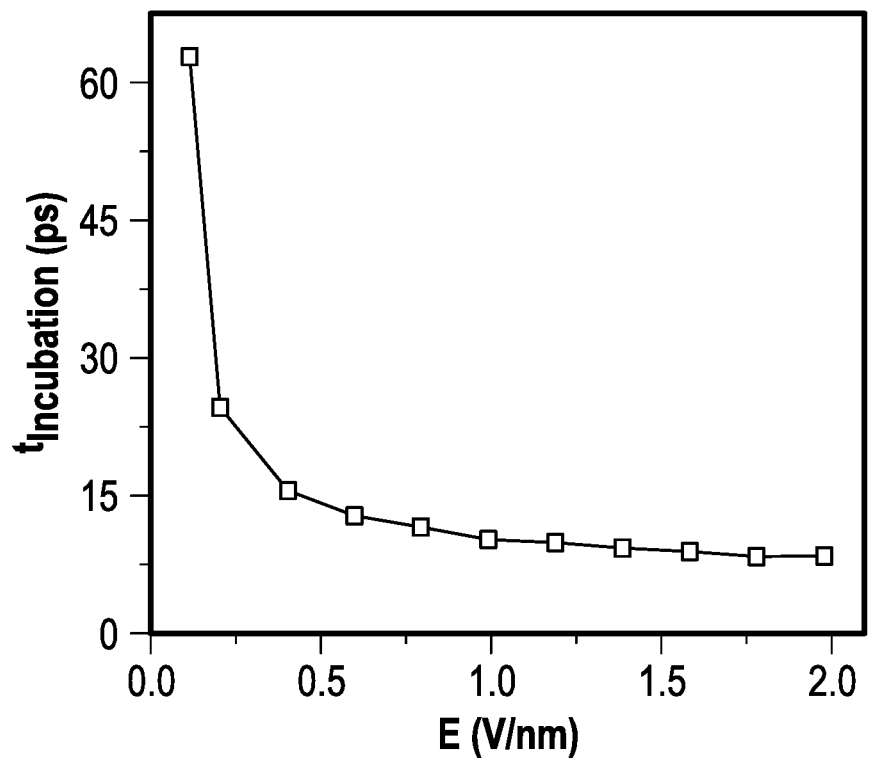
FIG. 4B is an incubation time as a function of an applied electric field for a 100 Oe constant biased magnetic field to the antiferromagnetic (AFM) layer of the exemplary AVM device.

FIG. 4B depicts an incubation time as a function of an applied electric field for a 100 Oe constant biased magnetic field to the antiferromagnetic (AFM) layer of the exemplary AVM device. As seen, a small electric field of about 0.5 to about 1.0 V/nm is sufficient to reduce the incubation substantially, making the AVM devices ideal for high integration memory density with fast switching speed and highly energy efficient.

Figure 5A:
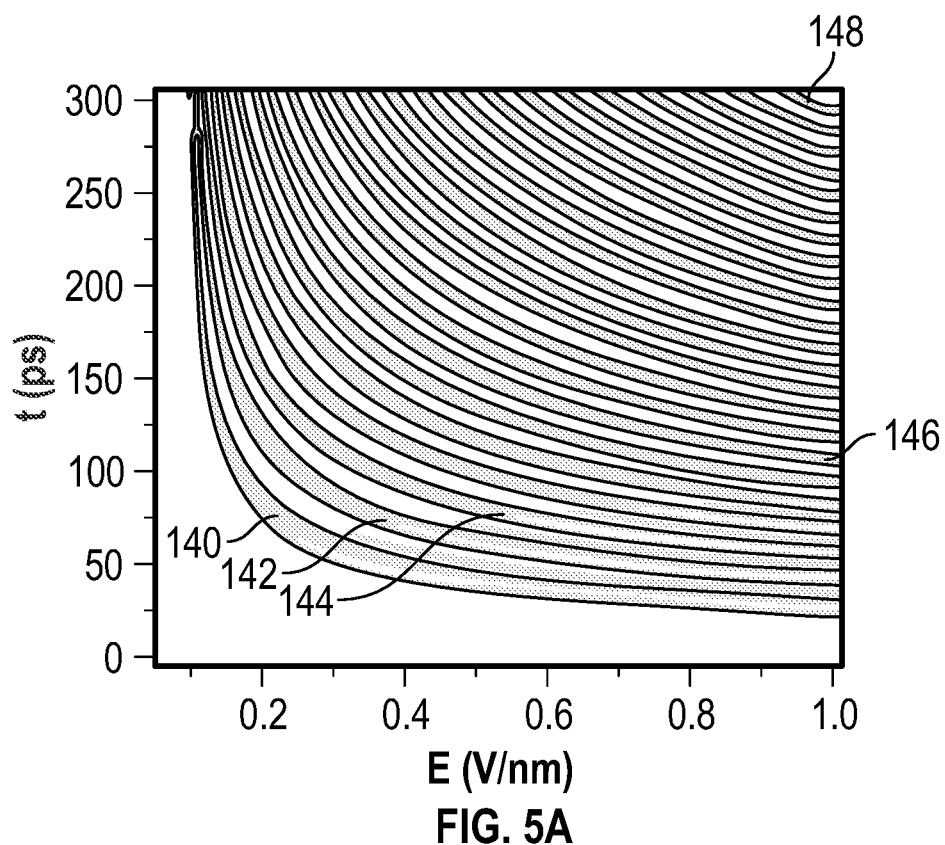
FIGS. 5A, and 5B is a simulated phase diagram of AFM switching at a constant biased magnetic field of 100 Oe for different electric field pulses times and amplitudes.
Figure 5B:
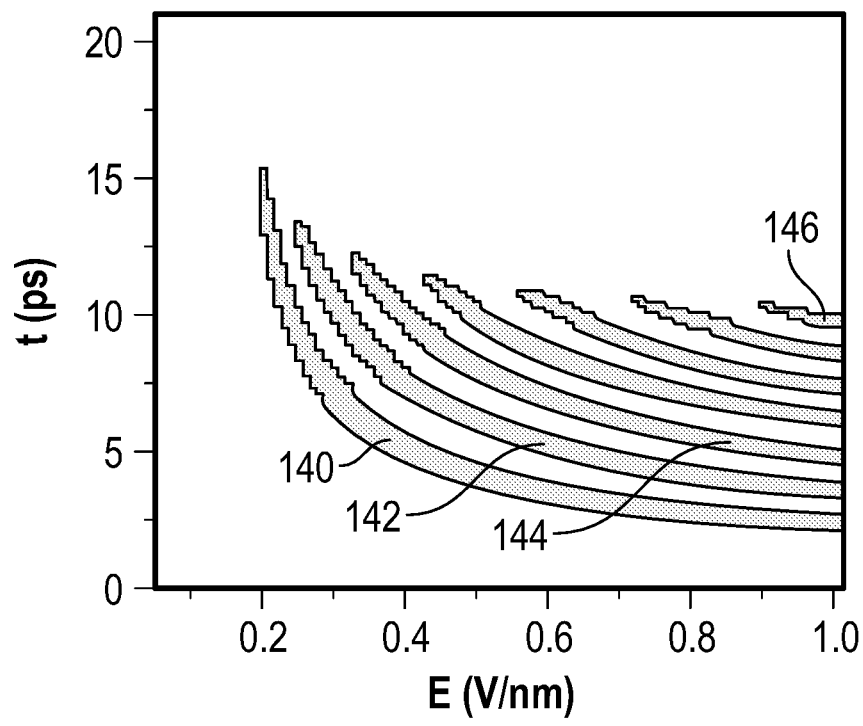
Figure 7A:
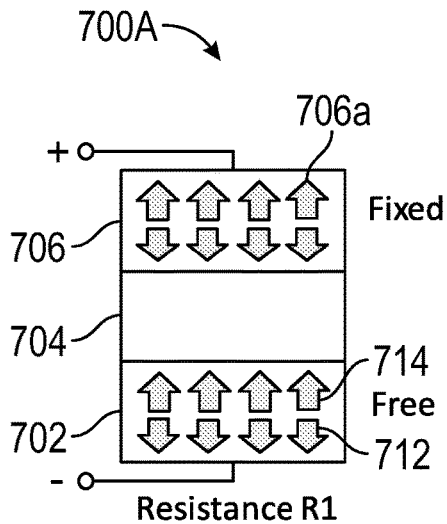
FIGS. 7A-B and 7C-D are two antiferromagnetic tunnel junction (AFM-TJ) memory devices of FIG. 6B.
Figure 7B:
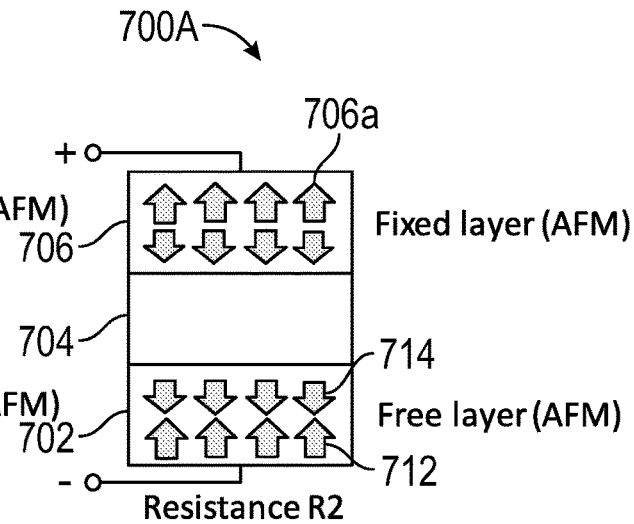
Figure 7C:
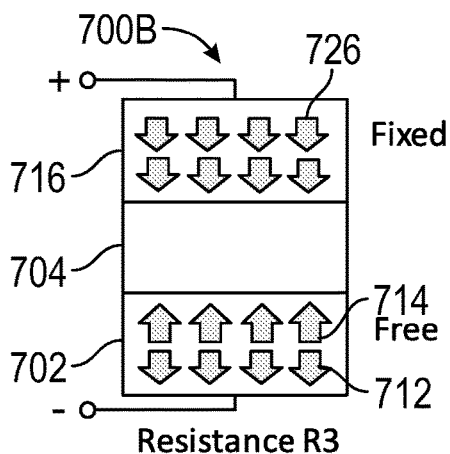
Figure 7D:
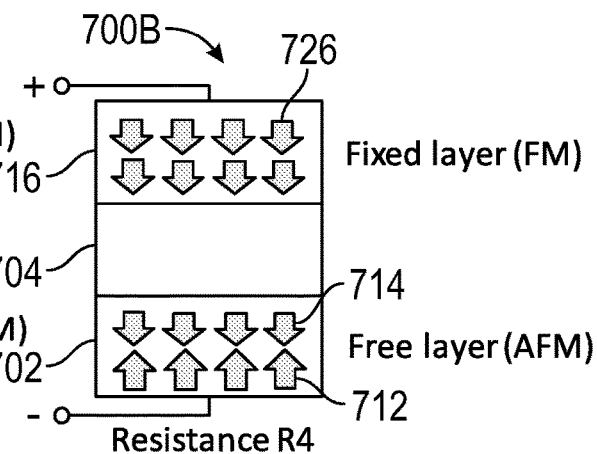

FIGS. 5A, 5B depict a simulated phase diagram of AFM switching at a constant biased magnetic field of 100 Oe for different electric field pulses times and amplitudes. FIG. 5B is a higher resolution view of FIG. 5A in time scale. Both figures illustrate cases with the same damping (α=0.02), but different exchange fields of (a) 7 T (Tesla), and (b) 1000 T. FIGS. 5A, 5B show that successful switching may take with parameters associated by curves 140-148 inclusively, while area outside the curves or between the curves are parameter values that no switching may take place. Simulations show that an electric field around 0.25V/nm with a switching time of less than 10 ps may be possible at higher applied voltages.

Since antiferromagnetic (AFM) materials offer unique characteristics that make them promising for spintronic device applications. These include ultrahigh-density memories with no inter-bit dipole interactions and potentially ultrafast write times (having intrinsic dynamics in the terahertz range). In addition, their high resonance frequencies may make them interesting for realizing compact room-temperature terahertz (THz) sources and detectors. However, all of these applications require efficient electrical means of controlling antiferromagnetic order.

FIG. 6a depicts an exemplary ferromagnetic current-controlled spin transfer torque (STT) device 180 (such as STT_MRAM) having a free layer 182, a dielectric layer 184 and a reference layer 186 (RL), forming a magnetic tunnel junction (MTJ). The free layer 182 may include ferromagnetic materials 183 exhibiting a magnetization polarity with or without an external magnetic field, the dielectric layer 184 may include MgO and the reference layer 186 may include ferromagnetic materials 181 also exhibiting a magnetization polarity through with or without an external magnetic field. A main difference is, when subjected to a change in magnetic field (by supplying a current) the ferromagnetic materials 181 in the reference layer 186 does not change in magnetization polarity while the ferromagnetic materials 183 in the free layer 182 do flip or switch in polarity. Therefore, memory arrays formed by STT devices 180 writes information through current switching mechanism, which is inferior to AVM devices which is written by switching a voltage and the current requirement for STT devices are much higher than the current requirement of the AVM devices.

Ultra high-speed switching may be achieved using anti-ferromagnetic resonance (AFMR), which can have frequencies of up to 1 THz due to the large built-in exchange field of the anti-ferromagnetic material. The AFM layers may be integrated into a magnetic tunnel junction (MTJ) for readout to be discussed later. Voltage-controlled magnetic memory (VCMA) effect may be used for writing in MTJs with free layers of AFM material to be discussed in FIGS. 6B and 7A to 7D.

FIG. 6B depicts an AVM device having a magnetic tunnel junction (MTJ) through which information is written by switching an electric field (instead of current). An antiferromagnetic tunnel junction (AFM-TJ) 200A may be formed by a free layer 202 of AFM material, a DE layer 204 and a reference layer 206 (RL). The AFM material 201, 203 in the free layer 202 may exhibit a vector sum M of net zero magnetization due to opposing orientations of the sublattices of magnetizations of 201, 203. The reference layer 206 (RL), likewise, is comprised of AFM material 207. The RL 206 may be disposed opposite to the free layer 202 of AFM material with respect to the layer 204 of DE material, such that the layer 204 of DE material is sandwiched between the RL 206 and the free layer 202 of AFM material forming the AFM-TJ 200A to be implemented in a memory device 200.

The free layer 202 of AFM material, the layer 204 of DE material and the RL 206 are further sandwiched between the two metallic electrodes 208 and 209. Although both the free layer 202 and the RL 206 both are composed of AFM material, the free layer 202 however, exhibits a different switching characteristic than the RL 206 under an applied electric field (pulsed or continuous). For example, an anisotropy (e.g., angular orientation of Néel vector l) of the free layer 202 of AFM material 201, 203 may be modified by an applied electric field E through a voltage pulse applied across the two metallic electrodes 208, 209. An anisotropy of the AFM material 207 in the reference layer 206 (RL), on the contrary, cannot be modified by an applied electric field (continuous or pulsed). In other words, the RL layer 206 is a fixed layer with fixed AFM material 207.

FIGS. 7A-B and 7C-D depicts two exemplary embodiments of the antiferromagnetic tunnel junction (AFM-TJ) memory devices 700A and 700B in FIG. 6B. The AFM-TJ memory device 700A has a fixed layer 706 (also known as a reference layer (RL)) composed of AFM material 706a which does not exhibit a magnetization polarity. However, the AFM-TJ memory device 700B has a fixed layer 716 composed of ferromagnetic (FM) material 726 which exhibits a magnetization polarity. Nevertheless, when an electric field is applied to both the AFM-TJ memory devices 700A and 700B, none of the fixed layers 706 or 716 changes in magnetization, while resistance of both the AFM-TJ memory devices 700A and 700B each changes according to the direction of the Néel vector l in the free layer 702, which may be read out by a circuit.

In the AFM-TJ memory devices 700B, the FM material 726 of the fixed layer may be comprised of one of: Iron (Fe), Cobalt (Co), alloy of Cobalt and Iron (CoFe), alloy of Cobalt, Iron and Boron (CoFeB), alloy of Cobalt and Platinum (CoPt), alloy of Iron and Platinum (FePt), alloy of Iron and Palladium (FePd) or any combinations thereof. The RL 706 is an antiferromagnetic (AFM) layer which is a fixed layer which does not change in magnetization when a voltage pulse is applied across two metallic electrodes. The AFM layer includes materials composed of one of: alloy of Iron and Manganese (FeMn), alloy of Platinum and Manganese (PtMn), alloy of Iridium and Manganese (IrMn), alloy of Iron and Rhodium (FeRh), alloy of Cobalt and Terbium (CoTb), alloy of Gadolinium and Iron (GdFe), or any combinations thereof. The AFM material 714, 716 in the free layer 702 in response to the voltage pulse applied across the two metallic electrodes, exhibits a direction of the Néel vector l corresponding to a formation of a resistance in the free layer 702.

As discussed in FIG. 6B above, the AFM layers (free layer 702, 706 or 726) may be integrated into a magnetic tunnel junction (MTJ) for readout. Magnetic tunnel junctions (MTJ) when implemented as AFM-TJ memory devices, may exhibit large data readout signals due to magneto-resistance characteristics in the AFM free layers (e.g., anisotropy may be modified by electric field).

FIGS. 8A-8D depict different mechanisms of magneto-resistance and may be configured in different configurations of antiferromagnetic materials to carry out writing data signals and data readout signals. For example, a first write and read mechanism may be shown by FIG. 8A, a direction of the Néel vector l corresponding to a formation of a resistance (High Resistance (HR) state or Low Resistance (LR)) state of an AVM device 410, in response to tunneling magneto-resistance (TMR) effect after a voltage pulse is applied across the two metallic electrodes.sandwiching a fixed layer 411, a dielectric layer 412 and a free layer 416. A fourth write and read mechanism may be shown by FIG. 8D, a direction of the Néel vector l corresponding to a formation of a resistance (HR or LR) of an AVM device 440, in response to tunneling anisotropic magneto-resistance (TAMR) effect after a voltage pulse is applied across the two metallic electrodes sandwiching a fixed layer 443, a dielectric layer 442 and a free layer 441.

Two other write read mechanism which form a resistance (HR or LR) of an AVM device 420 without forming MTJs, instead through anomalous Hall Effect (AHE) and AVM device 430 through anisotropic magneto-resistance (AMR). The TMR effects and TAMR effects are preferred write and read mechanism due to the AF-MTJs device structure which may easily be integrated into an at least two-terminal device with a plurality of electrode contacts (bit lines (BLs), source lines (SL) to form a memory array (see FIGS. 12 and 13 for further discussion).

The high or low resistance states (HR, LR) through the TMR or TAMR effects in each AVM device configuration may correspond to binary logic states of 0 (zero) or 1 (one), wherein the high or low resistance states (HR, LR) corresponding to the Néel vector l pointing in one of opposite directions of: in-plane (IP) (e.g. parallel to the interface between the layer of DE and the layer of AFM materials) and out-of-plane (OOP) (e.g. orthogonal to the interface between the layer of DE and the layer of AFM materials). The high or low resistance states (HR, LR) corresponding to the Néel vector l may be switched by an application of a voltage pulse across the layer of DE material (in the MTJ). A duration of the applied voltage pulse may be timed to odd multiples of an oscillation period of the Néel vector l (as shown in FIGS. 5A and 5B), and a duration of the applied voltage pulse is between 1 and 200 picoseconds (ps), and an amplitude of the applied voltage pulse for switching the Néel vector l is about one volt (1V) or less (see FIG. 2A, 3, 4B).

Figure 9B:
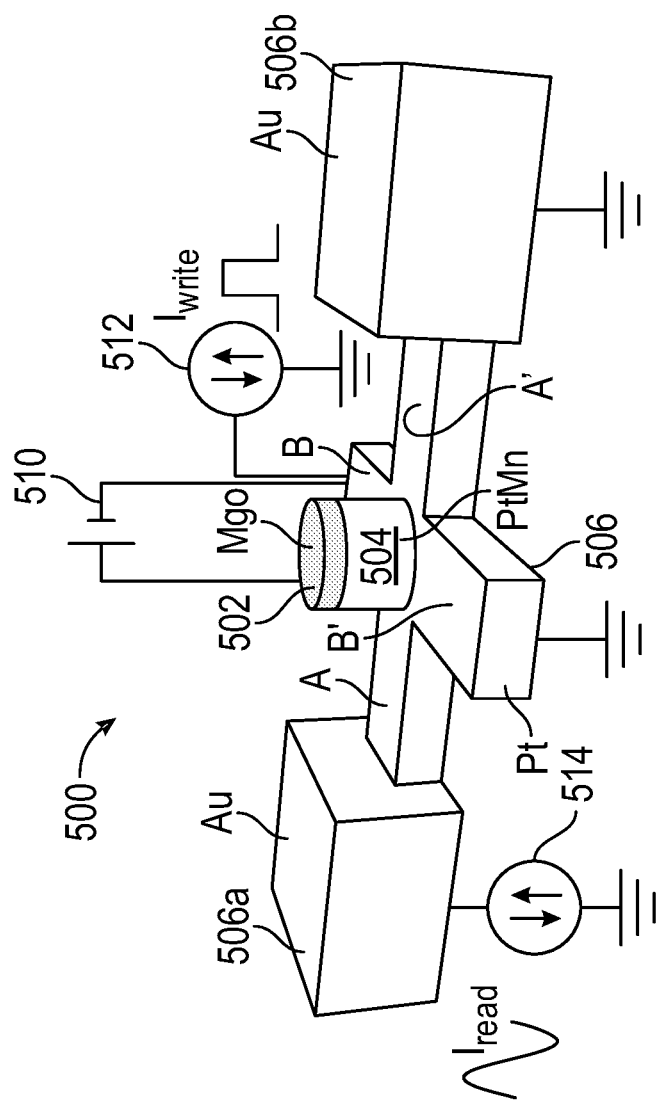
FIG. 9B is a device structure of an AVM device in FIG. 9A, including electrical contacts for reading and writing signals. The writing signals shown are the voltage (electric field), and a current in the underneath Pt layer that may assist in the writing. The write current may also provide writing by itself when in the absence of an electric field.
Figure 9A:
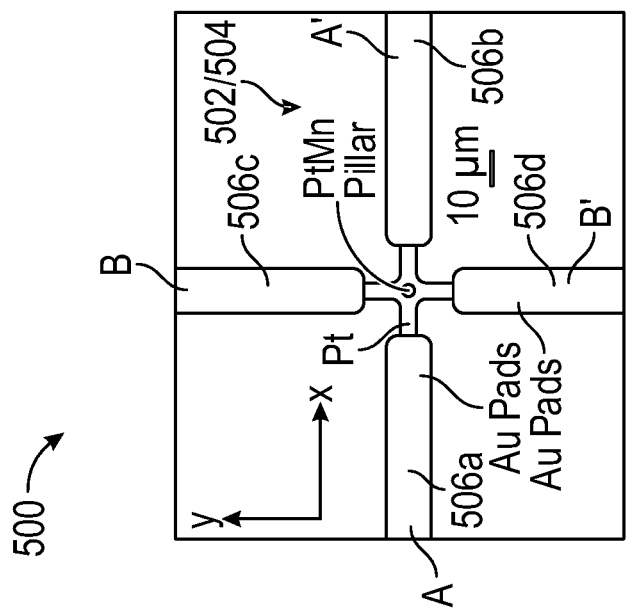
FIG. 9A is a device structure of an AVM device, including electrical contacts for reading and writing signals.

FIG. 9A depicts an embodiment of a device structure of an AVM device 500, including electrical contacts 506a to 506d for reading and writing signals.

FIG. 9B depicts a detail view of the embodiment of a device structure of an AVM device 500 in FIG. 9A, including electrical contacts 506 for reading and writing signals. The writing signals shown are the voltage (electric field), and a current in the underneath Pt layer 506 that may assist in the writing. The write current may also provide writing by itself when in the absence of an electric field The AFM order, e.g. the Néel vector l, may be manipulated optically, with strain, via exchange bias, and with electric fields. Of particular relevance is Néel vector l may be manipulated by electric currents in antiferromagnetic films with broken inversion symmetry (CuMnAs, $Mn_2Au$), and insulators (NiO) interfaced with large spin-orbit coupling materials (Pt). The manipulation mechanisms investigated were the damping-like torque originating from the relativistic spin-orbit coupling in the AFM, leading to current-induced spin polarization in the absence of equilibrium magnetization, and spin-orbit torque from the heavy metal, achieving writing current densities of 4 $mA/cm^2$ for CuMnAs, 10 $mA/cm^2$ for $Mn_2Au$, and 40 $mA/cm^2$ for NiO, respectively. Epitaxial films may be grown on lattice-matched substrates, and/or dielectric films that are hard to integrate into memory devices with electrical readout.

Some requirements of antiferromagnetic memories may be material compatibility with silicon-based manufacturing, low switching currents for reliability and interfacing with scaled transistors, and demonstration of memory operation in small patterned device structures. The devices that may achieve all three of these requirements, while providing new insights into the mechanisms of current-induced switching in antiferromagnetic thin films interfaced with heavy metals.

Figure 10A:
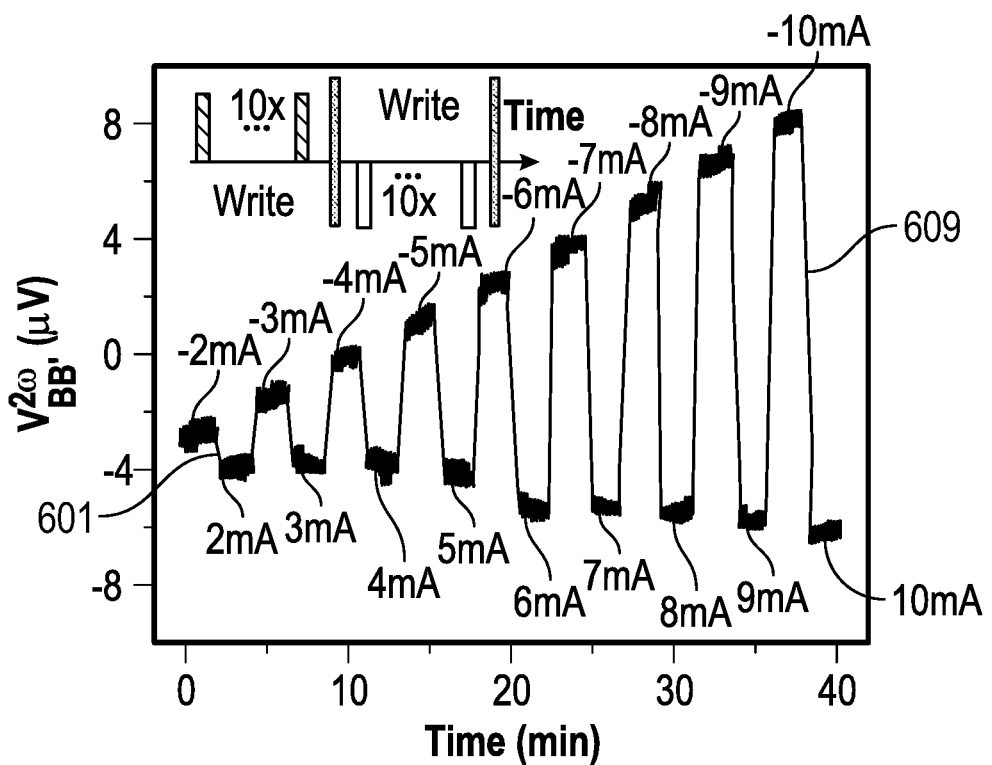
FIG. 10A is a second harmonic readout voltage between states, as a function of time for different write current pulses.
Figure 10B:
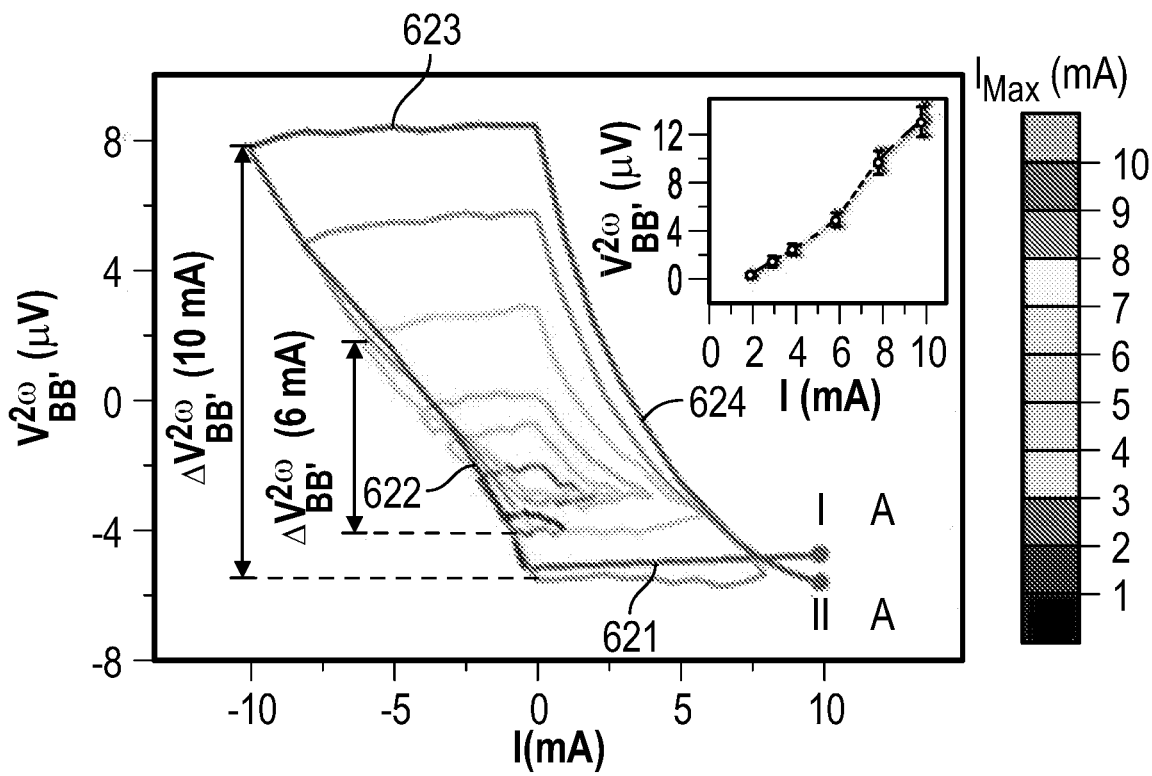
FIG. 10B is a second harmonic readout voltage variations between states, as a function of different write current pulses.

Electrical manipulation of Néel order in Pt/PtMn/MgO (see FIG. 9b) and Ta/PtMn/MgO structures having a circular PtMn pillar 504 with diameter of 4 to 10 μm (micrometer) and thickness from 6 to 10 nm being investigated (as shown in FIGS. 7, 9A, 9B) along with a writing current passed in-plane through the AVM device and its sign is changed to switch the antiferromagnetic order reversibly between different metastable states (as shown in FIGS. 10A, 10B).

Micromagnetic simulations indicate that these states may consist of non-uniform configurations combining multiple vortex and anti-vortex structures. The underlying physics of the switching hinges on a damping-like spin-orbit torque originating from both the AFM and heavy metal layers, and a Zhang-Li torque due to the spatial non-uniformities of the Néel order. Experimental data may also reveal an analog dependence of the readout signal on the last-largest current applied to the device 500. This may allow one to store more than one bit of information in a single memory element, or use it for storing synaptic weights in neuromorphic computing applications.

The significance of the chosen materials (PtMn, Pt, and Ta) is that they may be deposited by conventional sputtering at room temperature, and are already used within the reference layer (RL) and metallization layers of magnetic tunnel junctions (MTJ) in magnetic random-access memory, which major semiconductor foundries integrate with state-of-the-art silicon technology.

The first series of devices under investigation consists of Pt(5)/PtMn(6)/MgO(2.5) trilayers (thickness in nanometers), sputtered on a thermally oxidized silicon wafer (see FIG. 9B). The Pt layer acts as a source of spin current and the MgO is used as a protective capping layer. The Pt layer was patterned into a cross geometry (see FIG. 9A) with Au pads for multidirectional electrical measurements as shown in FIG. 9B. The PtMn on top of the Pt layer 506 was patterned into a circular pillar 504, with diameters ranging from 4 to 10 μm. The manipulation of the AFM order may be accomplished by bipolar current pulses 512 (writing currents), applied along the device terminals B-B' (see FIG. 9B), e.g. the vertical leg of the device. An amplitude of the applied voltage pulse 510 for switching the Néel vector l is reduced by an application of an in-plane (IP) electric current 512 through a metallic contact (such as the Pt layer 506) of the AFM material (such as the PtMn pillar 504), which generates a current-induced torque for magnetization of the AFM material in response to a spin-orbit interaction.

Readout may be achieved by a second-harmonic detection technique, similar to that previously used for CuMnAs films, where an ac reading current with amplitude 0.5 mA and frequency of about 501 Hz (Hertz) is applied in the direction A-A' (substantially perpendicular to the writing pulses). The second harmonic voltage response of the device is then measured along the B-B' direction, e.g. perpendicular to the ac probing current. Similar results were obtained by applying the current pulses in the horizontal leg (A-A') of the device and reading the second harmonic voltage along this same direction, while applying an ac reading current along B-B' (See Supplementary Note 51). Unless otherwise noted, all measurements were carried out at room temperature and in the absence of external magnetic fields. Further details of the measurement protocol are given under Methods: Measurements.

Referring to device structure 9b, Optical image of Pt/PtMn/MgO device 500 with a 4 pillar diameter. The electrical contacts (Au) 506a, 506b to the device 500 may be seen, while the heavy metal (Pt) is seen underneath the device in dark blue. A sketch of the device 500 including the read/write signal sources. An ac (alternating current) reading current may be applied along AA', while the writing pulse current and second-harmonic voltage readout may be applied/measured along BB'.

FIG. 10A depicts a second harmonic readout voltage between states, as a function of time for different write current pulses. FIG. 10B depicts a second harmonic readout voltage variations between states, as a function of different write current pulses.

FIG. 10A shows the second harmonic readout voltage, $V_{BB'}^{2\omega}$, as a function of time for a 4 μm pillar with PtMn thickness of 6 nm. The data are measured according to the writing protocol indicated in the inset of FIG. 10A. Each displayed value of the second-harmonic voltage is measured after one "write attempt", which consists of ten writing current pulses of about 10 millisecond (ms) width. The polarity of the writing pulses is alternated in successive write attempts, while their amplitude is increased successively in 1 mA steps. The data clearly indicate the electrical manipulation of the AFM order in the PtMn pillar, with a bi-stable state that can be set by changing the current polarity with a given amplitude. It is interesting to note that, for the range of currents applied in these measurements, larger write current amplitudes result in larger second-harmonic voltage difference between the two states.

To investigate this voltage-current dependence in more depth, we performed a second set of measurements that monitor the second-harmonic voltage as the write current is varied. First, one writing current pulse of 10 mA may be applied to set the initial state (point "I" in FIG. 10b). Then, measure the minor voltage-current loops for writing currents swept back and forth between negative and positive values (e.g. −1 mA to 1 mA to −2 mA to 2 mA, etc.) up to 10 mA (point "II" in FIG. 10b). For each writing current pulse 512, the readout (second harmonic) voltage was then measured after the write current 512 was set to zero. FIG. 10B may show that $V_{BB'}^{2\omega}$, as a function of current, measured with this protocol. Each minor loop represents the maximum current used for its generation (see color bar in FIG. 10B). FIG. 10B also shows the voltage variation $\Delta V_{BB'}^{2\omega}$, between the states (e.g. plateaus) stabilized by −6 to +6 mA and −10 to 10 mA sweeps, respectively.

FIG. 10A also shows that a Second harmonic voltage measured after write attempts in alternating directions. The absolute amplitude values of write current range from 2 mA to 10 mA. The writing protocol is shown in the inset. The shaded bars may denote writing pulse currents along BB' as shown in FIG. 9A, but in opposite directions. The long brown bars denote the ac reading voltage. FIG. 10B may show that current loops obtained by the second measurement protocol described in the main text. The minor loops demonstrate the manipulation of the metastable states of the AFM material. The inset shows the variation of the second harmonic signal as a function of the maximum current for each loop.

The gradual increase of $V_{BB'}^{2\omega}$ in successive loops indicates that the switching of the AFM order is taking place among different metastable states, identified by the plateaus in the minor loops. These states do not correspond to a complete rotation of the Néel vector, even in the case of 10 mA writing current (the maximum current that may be applied in these devices before electrical breakdown). In fact, in the case of uniform switching one would expect identical $\Delta V_{BB'}^{2\omega}$ values once the applied current overcomes a certain critical value.

FIG. 10B may summarize the readout voltage variation $V_{BB'}^{2\omega}$ as a function of the maximum applied current for different current loops. This plot may indicate a memristive behavior of these devices, where the readout voltage linearly depends on the maximum positive or minimum negative current previously applied to the device (see FIG. 10A). The plot also reveals that the minimum current to observe a measurable $V_{BB'}^{2\omega}$ value is IC~2 mA, from which one can infer a switching current density Jc of the order of 2 MA/cm2.

Figure 11:
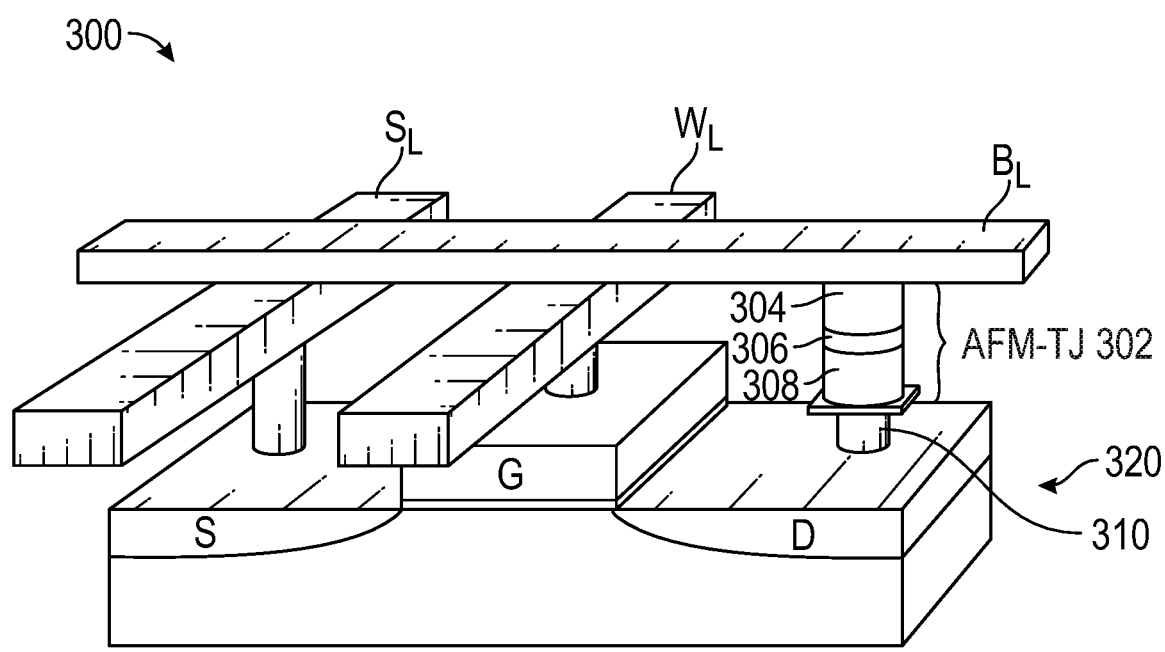
FIG. 11 is an AVM device where an antiferromagnetic tunnel junction is integrated on top of a select device (MOS transistor).

FIG. 11 depicts an embodiment of an AVM device 300 where an antiferromagnetic tunnel junction (AFM-TJ) 302 is integrated on top of a select device 320, such as a MOS transistor to form a 1 transistor-1 resistor (1T-1R) memory device structure (e.g., an antiferromagnetic voltage-controlled memory (AVM) device as shown in FIG. 11). The resistor is manifested by the characteristics of the AFM-TJ 302 under an applied voltage pulse, as previously described in the FIGS. 6A-6B, 7, 8A, and 8D.

More specifically, the AFM-TJ 302 may include: a fixed layer 304 of AFM material (e.g., the anisotropy of the AFM material is unchanged under an applied pulsed or continuous voltage), a dielectric layer 306 (such as MgO or NiO), and a free layer 308 of AFM material such as Pt/Mn (e.g., the anisotropy of the AFM material changes under an applied pulsed or continuous voltage). The select device 320 may be an at least two-terminal switching device such as a transistor 320 (e.g., metal oxide semiconductor field effect transistor (MOSFET), a bipolar junction transistor (BJT), or a two-terminal p-n junction device such as a Schottky diode.

As shown in FIG. 11, DE layer 306 of the AFM-TJ 302 may be coupled to a bit line (BL) or data electrode through the fixed layer 304. The free layer 308 of the AFM-TJ 302 may be coupled to a drain electrode D. In an embodiment, a metallic pillar 310 may be disposed between the drain electrode D and the free layer 308. A gate electrode G of the transistor may be coupled to a write line (WL). In practice, when data is written as a voltage pulse to the BL, the data may be stored in the AFM-TJ 302 through a change of resistance state from high resistance (HR) state to low resistance (LR) state (i.e., a reversal of the direction of magnetization in the AFM material), or from LR state to HR state as disclosed in FIGS. 6A-6B, 7 and 8A, 8D. The resistance state of the AFM-TJ 302 may be selected or controlled by the conductivity of the at least two terminal select device 320, which is through a controlling gate voltage at the WL and/or a source voltage at the SL. In effect, a binary logic of 1 or 0 may be realized through a single transistor structure when coupled with a resistance state of the AFM-TJ 302 through controlling the voltage level of the BL, the WL and the SL. The rate of switching may be in the THz range. Accordingly, a high-density memory array with writing speed in THz range may be realized through an array of the voltage-controlled 1 transistor-1 resistor (1T-1R) memory device structure—the AVM device.

Figure 12:
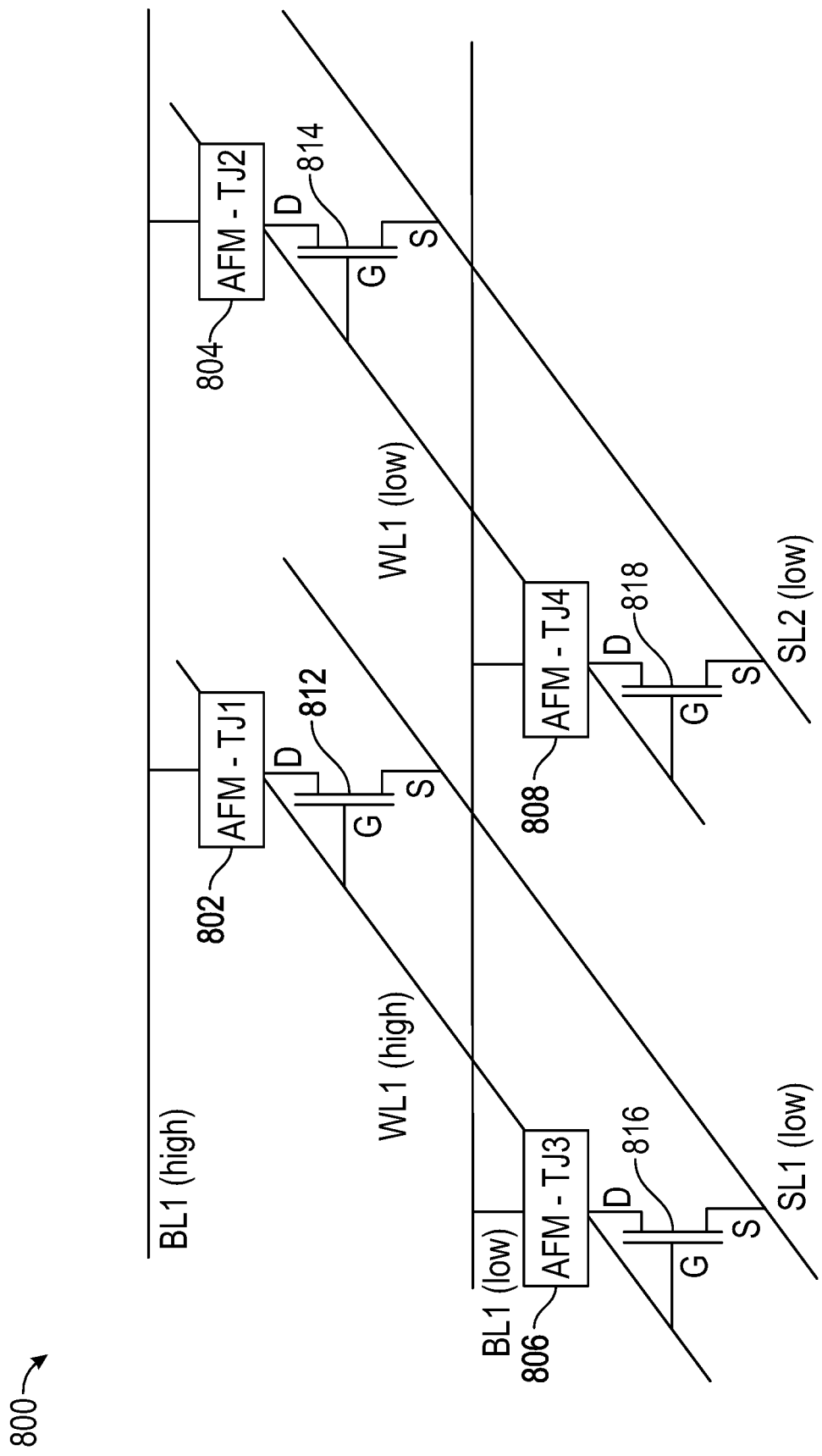
FIG. 12 is an implementation of the AFM-TJ memory devices as a memory array.

FIG. 12 illustrates an exemplary implementation of the AFM-TJ memory devices 802-808 as a memory array 800. Each of the AFM-TJ memory devices 802-808 may be implemented with a 1T-1R memory device structure, as previously described in FIG. 11. As shown in FIG. 12, rows and columns of the AVM devices 802-808 form the AVM memory array 800, wherein each of the AVM devices (e.g., 802) in the AVM memory array 800 is in series connection with a corresponding at least two-terminals select device (e.g. 812), wherein one of the two metallic electrodes (e.g., electrode connected to a fixed layer) of each of the AVM devices (e.g., 802) is connected to a same bit line (e.g., BL1) row-wise and another one of the two metallic electrodes (e.g., electrode connected to a free layer) of each of the AVM devices (e.g., 802) is connected to a same source line (e.g., SL1) column-wise, such that the row-wise BLs (BL1, BL2 . . . ) and the column-wise SLs (SL1, SL2 . . . ) form a cross-point structure (e.g., grid like structure) without making electrical contacts with each other in the AVM memory array 800.

The DE layer in each of the AVM devices (e.g., 802) may be connected to the same BL (e.g., BL1) row-wise, and the AFM layer (e.g., free layer in a MJT structure) in each of the AVM devices (e.g., 802) is connected to the same source line (e.g., SL1) column-wise. The at least two-terminals select device (812-818) is one of: a Field Effect Transistor (FET) or a Bipolar Junction Transistor (BJT).

Figure 13:
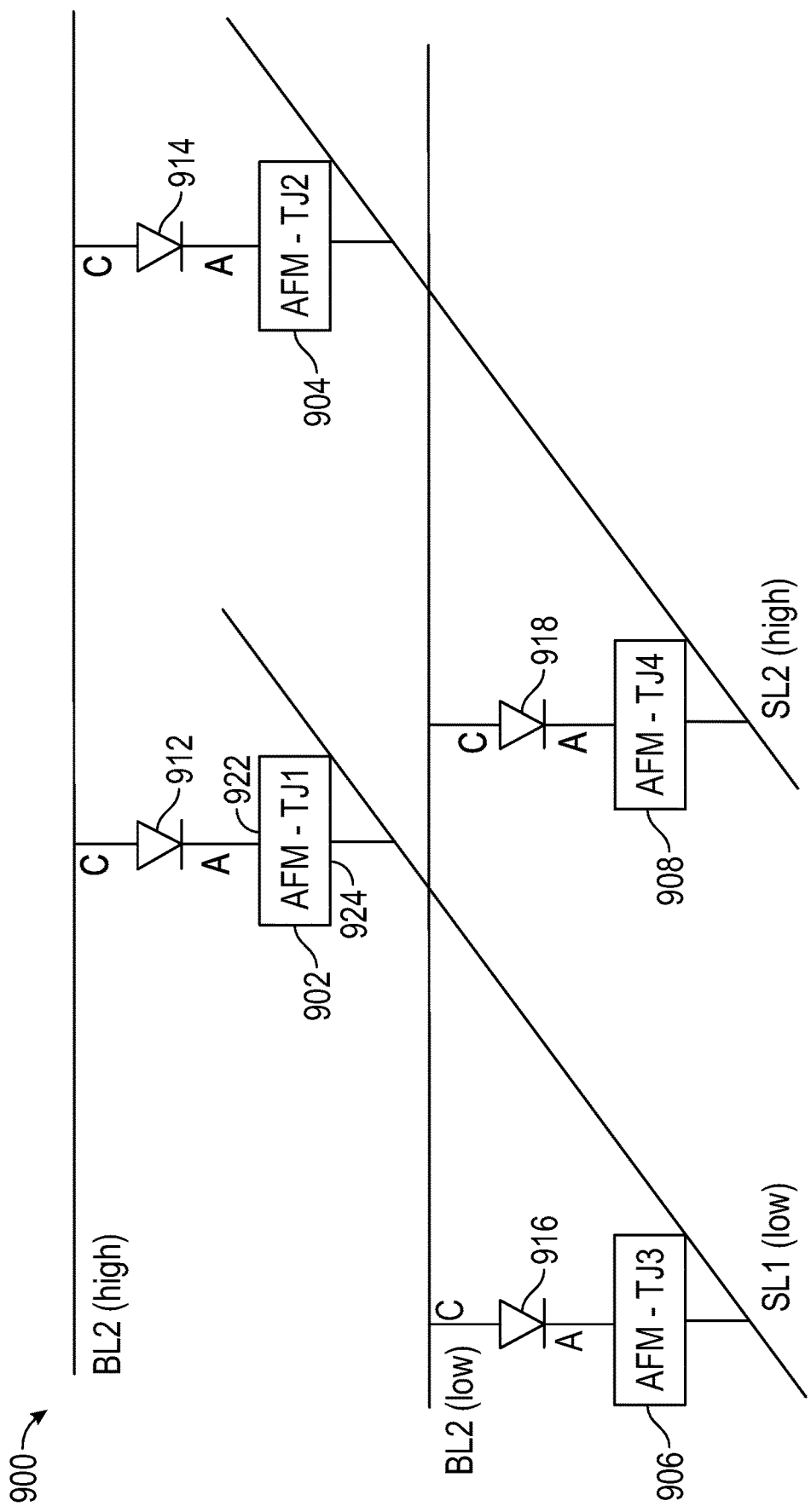
FIG. 13 is an implementation of the AFM-TJ memory devices as a memory array.

FIG. 13 illustrates another exemplary implementation of the AFM-TJ memory devices 902-908 as a memory array 900. The memory array 900 and memory array 800 may be in close resemblance except that the at least two-terminals select device 912-918 being a p-n junction switching device, such as a Schottky diode. As shown in FIG. 13, rows and columns of the AVM devices 902-908 form the AVM memory array 900, wherein each of the AVM devices (e.g., 902) in the AVM memory array 900 is in series connection with a corresponding two-terminals select device (e.g. 912), wherein one of the two metallic electrodes (e.g., electrode connected to a fixed layer) of each of the AVM devices (e.g., 902) is connected to a same bit line (e.g., BL1) row-wise and another one of the two metallic electrodes (e.g., electrode connected to a free layer) of each of the AVM devices (e.g., 802) is connected to a same source line (e.g., SL1) column-wise, such that the row-wise BLs (BL1, BL2 . . . ) and the column-wise SLs (SL1, SL2 . . . ) form a cross-point structure (e.g., grid like structure) without making electrical contacts with each other in the AVM memory array 900.

The DE layer in each of the AVM devices (e.g., 902) may be connected to the same BL (e.g., BL1) row-wise, and the AFM layer (e.g., free layer in a MJT structure) in each of the AVM devices (e.g., 902) is connected to the same source line (e.g., SL1) column-wise. the two-terminals select device (912-918) being a p-n junction switching device, such as a Schottky diode. More specifically, each of the DE layer of the AVM devices (e.g., 902) may be connected to a corresponding anode terminal A of the Schottky diode 912 and the cathode terminal C of the Schottky diode 912 is connected to the same BL (e.g., BL1).

A method of writing electrical signals to a particular AVM device (e.g., 802 or 902) in the AVM memory array (800 or 900) may include the following operations: setting a bit line (BL) (e.g., BL1) of a selected row (e.g., row 1) of the particular AVM device (802 or 902) to a first voltage (e.g., about 1V) higher than a threshold voltage (e.g., about 0.5V) required to turn on a series connected corresponding at least two-terminals select device (e.g., 812 or 912); setting a source line (SL) (e.g., SL1) of a selected column (e.g., column 1) of the particular AVM device (e.g., 802 or 902) to a second voltage close to or equal to zero volt (e.g., 0V). Performing one or both of: setting bit line (BL) (e.g., BL2, . . . BLn) of all other unselected rows (row 2 . . . row n) of other unselected AVM devices (806, 808 . . . or 906 . . . 908 . . . ) in the AVM memory array (800 or 900) to a third voltage close or equal to zero volts (e.g., 0V), setting source line (SL2, . . . SLn) of all other unselected columns (column 2 . . . column n) of other unselected AVM devices (804, 808 . . . or 904 . . . 908 . . . ) in the AVM memory array (800 or 900) to a fourth voltage higher or equal to the first voltage (1V) applied to the BL (e.g., BL1) of the selected row (row 1) of the particular AVM device (802, 902).

The first voltage applied to the BL (e.g., BL1) of the selected row (e.g., row 1) of the particular AVM device (812 or 912) has a duration which may be timed to odd multiples of an oscillation period of the Néel vector l. An electric current may be passed through the SL (e.g., SL1) of the selected column (column 1) of AVM device or the BL (e.g., BL1) of the selected row (e.g., row 1) of the particular AVM device (802 or 902), which provides a magnetic field, H or a spin-orbit torque, or a spin-transfer torque, in order to assist in switching in the particular AVM device (802, 902) to high or low resistance states (HR, LR) corresponding to binary logic states of 0 or 1.

Example applications based on antiferromagnets include, but are not limited to, embedded memory in processor chips, random access memory (RAM) in computers, smartphones, and servers, machine learning accelerators, wearable devices, graphics processing, edge computing, and/or autonomous systems (e.g. self-driving cars). Advantages include, but are not limited to, 100× faster than best state of the art solutions, 20× more energy-efficient than state of the art, immune to external magnetic fields (improves security and reduces packaging cost), and/or better scalability to devices dimensions below 20 nm. The description can relate to one or more of magnetoresistive random access memory (MRAM), magnetic memory, antiferromagnetic memory, voltage-controlled switch and/or magnetic tunnel junction. Implementations include, but are not limited to, artificial intelligence (AI), the internet of things (TOT), and/or edge computing, etc. or other memory-centric computing paradigms.

The VCMA-induced THz dynamics represent a method to achieve ultrafast spintronic devices based on AFMs, with low switching voltages that are determined by the AFM anisotropy, rather than exchange field. The devices provide effective switching for constant bias magnetic fields below 100 Oe, in the studied exchange field range from about 7 to 1000 T. For practical device applications in memory and computing, the total switching energy of the VCMA-induced reversal mechanism is an important figure of merit.

While various embodiments have been described, it can be apparent that many more embodiments and implementations are possible. Accordingly, the embodiments are not to be restricted.

I claim:

1. An antiferromagnetic voltage-controlled memory device comprising:
   (i) a layer of an antiferromagnetic material;
   (ii) a layer of dielectric material in contact with the layer of the antiferromagnetic material, where the layer of the antiferromagnetic material includes at least two sublattices of respective magnetizations M1 and M2, wherein a vector sum M=M1+M2 in the layer of the antiferromagnetic material being zero or close to zero in an absence of an external stimuli, and wherein a Neel vector l=M1−M2 in the layer of the layer of the antiferromagnetic material forms an angle Θ with respect to an interface between the layer of dielectric and the layer of the antiferromagnetic material; and
   (iii) two metallic electrodes sandwiching the layer of antiferromagnetic and the layer of dielectric materials, wherein the two metallic electrodes are configured to connect to a voltage supply, wherein an anisotropy of the layer of the antiferromagnetic material represented by the angle Θ formed with respect to the interface between the layer of dielectric material and the layer of the antiferromagnetic material, is modified by an applied electric field E across the layer of dielectric material.

2. The antiferromagnetic voltage-controlled memory device of claim 1, where when an electric field E is applied across the layer of dielectric material, the angle Θ has a value of about 0 or about 90 degrees which is formed with respect to an interface between the layer of dielectric material and the layer of the antiferromagnetic material.

3. The antiferromagnetic voltage-controlled memory device of claim 1, where the angle Θ at about 0 degree corresponds to the Neel vector l being in-a-plane with respect to the interface between the layer of dielectric material and the layer of the antiferromagnetic material, and the angle Θ at about 90 degrees correspond to the Neel vector l being out-of-a-plane with respect to the interface between the layer of dielectric and the layer of the antiferromagnetic material.

4. The antiferromagnetic voltage-controlled memory device of claim 1, where an applied electric field E across the layer of dielectric material is formed by applying a voltage pulse across the two metallic electrodes through connecting to the voltage supply.

5. The antiferromagnetic voltage-controlled memory device of claim 1, where the layer of the antiferromagnetic material comprising a portion of one of the two metallic electrodes.

6. The antiferromagnetic voltage-controlled memory device of claim 1, where the layer of dielectric material is comprised of a Magnesium oxide or a Nickel oxide.

7. The antiferromagnetic voltage-controlled memory device of claim 1, where the layer of the antiferromagnetic material comprises one of: an alloy of Iron and Manganese, an alloy of Platinum and Manganese, an alloy of Iridium and Manganese, an alloy of Iron and Rhodium, an alloy of Cobalt and Terbium, an alloy of Gadolinium and an Iron, or a Nickel oxide.

8. The antiferromagnetic voltage-controlled memory device of claim 1, where the two metallic electrodes comprise: a Tantalum, an Iridium, a Molybdenum, a Platinum, a Tungsten, a Ruthenium, a Copper, a Hafnium, a Bismuth, or any combinations thereof.

9. The antiferromagnetic voltage-controlled memory device of claim 1, where the layer of dielectric material interfaces a reference layer disposed in a position opposite to the layer of the antiferromagnetic material with respect to the layer of dielectric material, such that the layer of dielectric material is positioned between the reference layer and the layer of the antiferromagnetic material forming an antiferromagnetic tunnel junction memory device, where the layer of the antiferromagnetic material, the layer of dielectric material and the reference layer are sandwiched between the two metallic electrodes, and the anisotropy of the layer of the antiferromagnetic material is modified by an applied electric field E through a voltage pulse applied across the two metallic electrodes.

10. The antiferromagnetic voltage-controlled memory device of claim 9, where the reference layer comprises a ferromagnetic layer and a fixed layer which does not change in a magnetization when the voltage pulse is applied across the two metallic electrodes.

11. The antiferromagnetic voltage-controlled memory device of claim 10, where the ferromagnetic layer is comprised of one of: an Iron, a Cobalt, an alloy of Cobalt and Iron, an alloy of Cobalt, Iron and Boron, an alloy or a layered structure of Cobalt and Platinum, an alloy or layered structure of Iron and Platinum, an alloy or a layered structure of Iron and Palladium or any combinations thereof.

12. The antiferromagnetic voltage-controlled memory device of claim 9, where the reference layer comprises an antiferromagnetic layer and a fixed layer which does not change in a magnetization when the voltage pulse is applied across the two metallic electrodes.

13. The antiferromagnetic voltage-controlled memory device of claim 12, where the antiferromagnetic layer comprises one of: an alloy of Iron and Manganese, an alloy of Platinum and Manganese, an alloy of Iridium and Manganese, an alloy of Iron and Rhodium, an alloy of Cobalt and Terbium, an alloy of Gadolinium and Iron, or any combinations thereof.

14. The antiferromagnetic voltage-controlled memory device of claim 9, where the antiferromagnetic layer comprises a free layer which in response to the voltage pulse applied across the two metallic electrodes, exhibits a direction of the Neel vector l corresponding to a formation of a resistance in the free layer.

15. The antiferromagnetic voltage-controlled memory device of claim 9, where a direction of the Neel vector l corresponds to a formation of a resistance of the antiferromagnetic voltage-controlled memory device, in response to a tunneling anisotropic magnetoresistance effect after the voltage pulse is applied across the two metallic electrodes.

16. The antiferromagnetic voltage-controlled memory device of claim 1, where the antiferromagnetic voltage-controlled memory device exhibits a high resistance state or a low resistance state corresponding to a binary logic state of a zero or a one, respectively.

17. The antiferromagnetic voltage-controlled memory device of claim 1, wherein rows and columns of the antiferromagnetic voltage-controlled memory devices form an antiferromagnetic voltage-controlled memory array, each of the antiferromagnetic voltage-controlled memory devices in the antiferromagnetic voltage-controlled memory array is connected in series with a corresponding at least two-terminal select device, wherein one of the two metallic electrodes of each of the antiferromagnetic voltage-controlled memory devices is connected to a same bit line row-wise, and another one of the two metallic electrodes of each of the antiferromagnetic voltage-controlled memory devices is connected to a same source line column-wise, such that the row-wise bit lines and the column-wise source lines form a cross-point structure without making an electrical contact with each other in the antiferromagnetic voltage-controlled memory array.

18. A method of writing electrical signals to a particular antiferromagnetic voltage-controlled memory device in the antiferromagnetic voltage-controlled memory array of claim 17, comprising:
setting a bit line of a selected row of a particular antiferromagnetic voltage-controlled memory array to a first voltage higher than a threshold voltage required to turn on a series connected corresponding at least two-terminals select device;
setting a source line of a selected column of the particular antiferromagnetic voltage-controlled memory array to a second voltage close to or equal to zero volts,
performing one or both of:
setting a bit line of all other unselected rows of a plurality of unselected antiferromagnetic voltage-controlled memory devices in the antiferromagnetic voltage-controlled memory array to a third voltage close or equal to zero volts,
setting a source line of a plurality of unselected columns of other unselected antiferromagnetic voltage-controlled memory devices in the antiferromagnetic voltage-controlled memory array to a fourth voltage higher than or equal to the first voltage applied to the bit line of the selected row of the particular antiferromagnetic voltage-controlled memory device.

19. The method of claim 18, wherein the first voltage applied to the bit line of the selected row of the particular antiferromagnetic voltage-controlled memory device has a duration which is timed to an odd multiple of an oscillation period of the Neel vector l.

20. The method of claim 18, where an electric current is passed through the source line of the selected column of the particular antiferromagnetic voltage-controlled memory device or the bit line of the selected row of the particular antiferromagnetic voltage-controlled memory device, which provides a magnetic field, or a spin-orbit torque, or a spin-transfer torque, that facilitates switching in the particular antiferromagnetic voltage-controlled memory device to high resistance state or low resistance state corresponding to a binary logic state of a zero or a one.

* * * * *